United States Patent
Derkacs et al.

(10) Patent No.: US 11,784,272 B2
(45) Date of Patent: Oct. 10, 2023

(54) MULTIJUNCTION SOLAR CELL

(71) Applicant: SolAero Technologies Corp., Albuquerque, NM (US)

(72) Inventors: Daniel Derkacs, Albuquerque, NM (US); Andrew Colin Espenlaub, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 0 days.

(21) Appl. No.: 17/731,399

(22) Filed: Apr. 28, 2022

(65) Prior Publication Data

US 2022/0352405 A1 Nov. 3, 2022

Related U.S. Application Data

(60) Provisional application No. 63/181,484, filed on Apr. 29, 2021.

(51) Int. Cl.
| | |
|---|---|
| *H01L 31/065* | (2012.01) |
| *H01L 31/054* | (2014.01) |
| *H01L 31/0725* | (2012.01) |
| *H01L 31/18* | (2006.01) |
| *H01L 31/0735* | (2012.01) |

(Continued)

(52) U.S. Cl.
CPC ........ *H01L 31/065* (2013.01); *H01L 31/0547* (2014.12); *H01L 31/0725* (2013.01); *H01L 31/0735* (2013.01); *H01L 31/1844* (2013.01); *H01L 31/1852* (2013.01); *B64G 1/443* (2013.01); *H01L 31/0687* (2013.01)

(58) Field of Classification Search
CPC . H01L 33/46; H01L 31/03046; H01L 31/056; H01L 31/0687; H01L 31/06875; H01L 31/0725; H01L 31/0547; H01L 31/065; H01L 31/0735; H01L 31/1844; H01L 31/1852; B64G 1/443
See application file for complete search history.

(56) References Cited

U.S. PATENT DOCUMENTS

| | | |
|---|---|---|
| 4,156,310 A | 5/1979 | Kamath |
| 4,575,577 A | 3/1986 | Fraas |
| 5,373,522 A | 12/1994 | Holonyak, Jr. et al. |

(Continued)

FOREIGN PATENT DOCUMENTS

| | | |
|---|---|---|
| JP | 2001237500 A | 8/2001 |
| JP | 2004296658 A | 10/2004 |

(Continued)

OTHER PUBLICATIONS

Wangqing Yan, and DC Hall—Variable-angle spectroscopic ellipsometry of InAlP native oxide dielectric layers for GaAs metal-oxide-semiconductor field effect transitor applications. Journal of Applied Physics 113, 103515 (2013).

(Continued)

*Primary Examiner* — Mayla Gonzalez Ramos

(57) ABSTRACT

A multijunction solar cell including a substrate and a top (or light-facing) solar subcell having an emitter layer, a base layer, and a window layer adjacent to the emitter layer, the window layer composed of a material that is optically transparent, has a band gap of greater than 2.6 eV, and includes an appropriately arranged multilayer antireflection coating on the top surface thereof.

19 Claims, 9 Drawing Sheets

(51) Int. Cl.
*H01L 31/0687* (2012.01)
*B64G 1/44* (2006.01)

(56) References Cited

U.S. PATENT DOCUMENTS

| | | | |
|---|---|---|---|
| 9,356,162 B2 | 3/2016 | Pan et al. | |
| 2003/0145884 A1* | 8/2003 | King | H01L 31/0725 136/255 |
| 2004/0200523 A1 | 10/2004 | King et al. | |
| 2010/0186822 A1* | 7/2010 | Pan | H01L 31/0735 257/E31.127 |
| 2012/0285526 A1* | 11/2012 | Jones-Albertus | H01L 31/02167 136/256 |
| 2013/0228216 A1* | 9/2013 | Cornfeld | H01L 31/06875 136/255 |
| 2014/0373906 A1* | 12/2014 | Suarez | H01L 31/02168 136/255 |
| 2017/0110614 A1* | 4/2017 | Derkacs | H01L 31/0725 |
| 2019/0013430 A1* | 1/2019 | Jones-Albertus | H01L 31/03048 |
| 2020/0013665 A1* | 1/2020 | Kim | C04B 38/068 |

FOREIGN PATENT DOCUMENTS

| | | | | |
|---|---|---|---|---|
| JP | 2007504659 A | 3/2007 | | |
| JP | 2007335753 A | 12/2007 | | |
| JP | 200944171 A | 2/2009 | | |
| JP | 5618474 B2 | 9/2014 | | |
| JP | 6503919 B2 | 4/2019 | | |
| WO | WO-2020072458 A1 * | 4/2020 | | H01L 31/03046 |

OTHER PUBLICATIONS

Van Riesen S.,et al—"Degradation Study of III-V Solar Cells for Concentrator Applications"—Progress in Photovoltaics: Research and Applications, vol. 13:369-380 (2005).

Sanfacon, Michael M. et al., Analysis of AlGaAsGaAs Solar Cell Structures by Optical Reflectance Spectroscopy—IEEE Transactions on Electron Devices, vol. 37(2):450-454 (1990).

Islam, M.R. et al., "Effects of thermally grown native oxides on the luminescence properties of compound semiconductors", Appl. Physics Lett, vol. 69 (7):946-948 (1996).

Cao, Y et al., "Electrical properties of InAlP native oxides for metal-oxide-semiconductor device applications",—Applied Physics Letters, vol. 86:062105-1-062105-3 (2005).

Algora Del Valle, carlos et al., "Performance of Antireflecting Coating—AlGaAs Window Layer Coupling for Terrestrial Concentrator GaAs Solar Cells.", IEEE Transactions on Electron Devices, vol. 44 (9):1499-1506 (1977).

Islam, M.R. et al., "Luminescence characteristics InAlP InGaP heterostructures having native-oxide windows" Journal of Crystal Gowth, vol. 170:13-417 (1997).

* cited by examiner

MULTIJUNCTION SOLAR CELL

REFERENCES TO RELATED APPLICATIONS

The present application claims benefit of U.S. Provisional Application Ser. No. 63/181,484 filed Apr. 29, 2021.

The present application is related to U.S. patent application Ser. No. 15/464,651 filed Mar. 10, 2017, now U.S. Pat. No. 10,910,506 hereby incorporated by reference.

BACKGROUND

1. Field of the Invention

The present disclosure relates to solar cells and the fabrication of solar cells, and more particularly the design and specification of the window layer in the top solar subcell, and the antireflective coating layer, in multijunction solar cells based on III-V semiconductor compounds.

2. Description of the Related Art

Solar power from photovoltaic cells, also called solar cells, has been predominantly provided by silicon semiconductor technology. In the past several years, however, high-volume manufacturing of III-V compound semiconductor multijunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

In satellite and other space related applications, the size, mass and cost of a satellite power system are dependent on the power and energy conversion efficiency of the solar cells used. Putting it another way, the size of the payload and the availability of on-board services are proportional to the amount of power provided by the photovoltaic power system. Thus, as payloads become more sophisticated, weight or mass of the photovoltaic power system, and more particularly the power-to-weight ratio of the solar cells becomes increasingly more important, and there is increasing interest in lighter weight, "thin film" type solar cells having both high efficiency and low mass.

The efficiency of energy conversion, which converts solar energy (or photons) to electrical energy, depends on various factors such as the design of solar cell structures, the choice of semiconductor materials, and the thickness of each cell. In short, the energy conversion efficiency for each solar cell is dependent on the optimum utilization of the available sunlight across the solar spectrum by the subcells in a multijunction solar cell. As such, the characteristic of sunlight absorption in semiconductor material, also known as photovoltaic properties, is critical to determine the most efficient number and sequence of subcells, and the semiconductor material (with specific band gap, thickness, and electrical properties) in each subcell, to achieve the optimum energy conversion.

Typical III-V compound semiconductor solar cells are fabricated on a semiconductor wafer in vertical, multijunction structures or stacked sequence of solar subcells, each subcell formed with appropriate semiconductor layers and including a p-n photoactive junction. Each subcell is designed to convert photons over different spectral or wavelength bands to electrical current. After the sunlight impinges on the front of the solar cell, and photons pass through the subcells, the photons in a wavelength band that are not absorbed and converted to electrical energy in the region of one subcell propagate to the next subcell, where such photons are intended to be captured and converted to electrical energy, assuming the downstream subcell is designed for the photon's particular wavelength or energy band.

The individual solar cells or wafers are then disposed in horizontal arrays, with the individual solar cells connected together in an electrical series and/or parallel circuit. The shape and structure of an array, as well as the number of cells it contains, are determined in part by the desired output voltage and current needed by the payload or subcomponents of the payload.

The energy conversion efficiency of multijunction solar cells is affected by such factors as the number of subcells, the thickness of each subcell, and the band structure, electron energy levels, conduction, and absorption of each subcell. Factors such as the short circuit current density ($J_{sc}$), the open circuit voltage ($V_{oc}$), and the fill factor are also important characterizing parameters in describing a subcell.

One of the important mechanical or structural considerations in the choice of semiconductor layers for a solar cell is the desirability of the adjacent layers of semiconductor materials in the solar cell, i.e. each layer of crystalline semiconductor material that is deposited and grown to form a solar subcell, have similar crystal lattice constants or parameters.

Many III-V devices, including solar cells, are fabricated by thin epitaxial growth of III-V compound semiconductors upon a relatively thick substrate. The substrate, typically of Ge, GaAs, InP, or other bulk material, acts as a template for the formation of the deposited epitaxial layers. The atomic spacing or lattice constant in the epitaxial layers will generally conform to that of the substrate, so the choice of epitaxial materials will be limited to those having a lattice constant similar to that of the substrate material.

The window layer is a semiconductor layer typically having a thickness of between 200 and 300 Angstroms (or 20 to 30 nm) that is disposed between the surface layer (which may be the antireflection coating or ARC layer, or the contact layer on which is deposited metallic grid lines over the top surface of the contact layer) and the emitter layer of the top subcell, or between the upper tunnel diode and the emitter layer of a lower subcell. The window layer is introduced in the vertical stack of semiconductor layers to improve subcell efficiency by preventing minority carrier recombination at the top surface of the emitter layer, thereby permitting the minority carriers present in the emitter to migrate to the p-n junction of the subcell, thereby contributing to the extracted electrical current. By being identified as a distinct layer, the window layer will have a composition that differs from both the adjacent layer above the window layer and the emitter layer, but will generally be lattice matched to both semiconductor layers.

In some embodiments, the window layer may have a higher band gap than the adjacent emitter layer, with the higher band gap tending to suppress minority-carrier injection into the window layer, and as a result tending to reduce the recombination of electron-hole pairs that would otherwise occur in the window layer, thereby decreasing the efficiency of photon conversion at that subcell, and thus the overall efficiency of the solar cell.

Since the window layer is directly adjacent to the emitter layer, the interface with the emitter layer is appropriately designed so as to minimize the number of minority carriers entering the window. Another characteristic is the deep energy levels in the band gap, and here again one wishes to minimize such deep energy levels which would tend to create sites that could participate in Shockley-Read-Hall (SRH) recombination of electron-hole pairs. Since crystal defects can cause these deep energy levels, the composition and morphology of the window layer should be capable of forming an interface with the emitter layer that would minimize the crystal defects at the interface.

The oxidation of a window layer for the purpose of enhancing the efficiency of a solar cell is very generically known from U.S. Pat. No. 9,356,162 of Pan et al. However, the specific composition of the window layer and the oxidation process taught therein are quite restricted and limited, and the resulting manufacturability and the quantum efficiency associated with such prior art is demonstrably highly unsatisfactory from a commercial perspective.

In order to substantially improve the efficiency of a solar cell even further, the present disclosure proposes additional design features for the material and the fabrication methodology of the window layer that have heretofore not been considered or proposed.

SUMMARY OF THE INVENTION

1. Objects of the Disclosure

It is an object of the present disclosure to provide increased photoconversion efficiency in a multijunction solar cell by optimally adjusting the composition of the window layer disposed above the top (or light-facing) solar subcell.

It is another object of the present disclosure to provide increased photoelectric efficiency in a multijunction solar cell by providing a window layer of the top solar subcell composed of a material having a bad gap of greater than 2.5 eV.

It is another object of the present disclosure to provide improved photoelectric efficiency in a multijunction solar cell by oxidizing a portion of the thickness of an InAlP window layer in the top solar subcell from the emitter/window layer contact surface to the top surface of the window layer while the solar cell is in the growth reactor.

It is another object of the present disclosure to provide a method of fabricating a multijunction solar cell by dry or wet oxidation of the window layer of the top solar subcell while the solar cell is in the growth reactor.

It is another object of the present disclosure to provide increased photoelectric efficiency in a multijunction solar cell by providing a passivation layer below the window layer and above the emitter layer of the top solar subcell.

It is another object of the present disclosure to provide improved photoelectric efficiency in a multijunction solar cell by oxidizing a portion of the thickness of an InAlP window layer in the top solar subcell from the emitter/window layer contact surface to an oxidation stop layer disposed over the top surface of the emitter layer of the top solar subcell.

It is another object of the present disclosure to provide a method of fabricating a multijunction solar cell by dry or wet oxidation of the window layer of the top solar subcell down to an oxidation stop layer disposed directly over the emitter of the top solar subcell.

It is another object of the present disclosure to provide increased photoconversion efficiency in a multijunction solar cell by optimally adjusting the composition of the antireflective coating layer which is above the window layer of the top (or light-facing) solar subcell.

It is another object of the present disclosure to provide increased photoconversion efficiency in an upright metamorphic multijunction solar cell or in an inverted metamorphic multijunction solar cell by fabrication of a window layer with a band gap greater than 2.5 eV disposed above the top solar subcell prior to the deposit and etching of a cap layer over the window layer.

Some implementations of the present disclosure may incorporate or implement fewer of the aspects and features noted in the foregoing objects.

2. Features of the Disclosure

All ranges of numerical parameters set forth in this disclosure are to be understood to encompass any and all subranges or "intermediate generalizations" subsumed herein. For example, a stated range of "1.0 to 2.0 eV" for a band gap value should be considered to include any and all subranges beginning with a minimum value of 1.0 eV or more and ending with a maximum value of 2.0 eV or less, e.g., 1.1 to 2.0 eV, or 1.3 eV to 1.4 eV, or 1.5 to 1.9 eV.

Briefly, and in general terms, the present disclosure provides a multijunction solar cell including a plurality of solar subcells on a semiconductor growth substrate comprising: a top (or light-facing) solar subcell having an emitter layer, a base layer forming a photovoltaic junction, and a window layer disposed adjacent to and above the emitter layer, the window layer having a band gap of greater than 2.5 eV.

In some embodiments, the window layer is composed of a zinc blende lattice structure composed of any of the Zn, S, Se, Mg or Cd II-VI compound semiconductors subject to the constrains of having the in-plane lattice parameter through its thickness being greater than or equal to the lattice constant of the growth substrate, having a band gap of greater than 2.6 eV, and a thickness of less than 100 nm.

In another aspect, the present disclosure provides a multijunction solar cell comprising a top (or light-facing) solar subcell having an emitter layer, a base layer, and a window layer adjacent to the emitter layer, composed of a window material having a band gap of greater than 4 eV and a thickness of less than 30 nm.

In some embodiments, there further comprises (i) a passivation layer disposed over the emitter layer of the top solar subcell, with the window layer being disposed directly over the passivation layer, and (ii) a cap layer disposed over the window layer, with portions of the top surface of the cap layer being subsequently etched down to the surface of the window layer.

In some embodiments, the emitter of the top solar subcell is composed of InAlGaP with the aluminum content in the range of 10 to 40% by mole fraction.

In some embodiments, the window layer of the top solar subcell is composed of an oxidized material.

In some embodiments, the window layer of the top solar subcell is composed of AlInGaAs or AlGaAs that is oxidized partially or entirely throughout its thickness.

In some embodiments, an oxidation stop layer is disposed below the window layer, and above the emitter layer of the top solar subcell.

In some embodiments, the window layer of the top solar subcell is composed of InAlP with an Al content approximately 65% by mole fraction and a thickness between 10 and 40 nm.

In some embodiments, the window layer of the top solar subcell is composed of AlInGaAs or AlGaAs with an Al content in the range of 40 to 80% by mole fraction and a thickness between 10 and 40 nm.

In some embodiments, in which the window layer of the top solar subcell is composed of InAlP, the oxidation stop layer is composed of InAlP with an Al content of 50% by mole fraction and a thickness of between 5 and 10 nm.

In some embodiments, in which the window layer is composed of AlInGaAs or AlGaAs, the oxidation stop layer is composed of InAlP with an Al content in the range of 50 to 65% by mole fraction and has a thickness between 5 and 10 nm.

In some embodiments, a cap layer is disposed over the window layer of the top solar subcell, with portions of the cap layer being subsequently etched down to the surface of the window layer.

In some embodiments, portions of the window layer being exposed following etching of portions of the cap layer are subsequently subjected to an oxidation process.

In some embodiments, the oxidation process is a wet oxidation process.

In some embodiments, the multijunction solar cell is fabricated in an MOCVD reactor, and the window layer of the top solar subcell material is oxidized after removal of the solar cell from the reactor, with the oxidation performed in a separate apparatus.

In some embodiments, the oxidation process in the separate apparatus is a wet or dry oxidation process.

In some embodiments, at least 10 nm of the top surface of the window layer is oxidized.

In some embodiments, the window layer is composed of InAlP or InGaP and the Al content at the bottom surface of the window layer is 48.5% or less.

In some embodiments, the window layer is composed of InAlP or InGaP and the Al content at the bottom surface of the window layer is 48.9% or less.

In some embodiments, the window layer is composed of InAlP or InGaP and the Al content at the top surface of the window layer is 53.6% or more.

In some embodiments, the window layer is composed of InAlP or InGaP and the gradation in Al content in the layer at from the bottom surface to the top surface of the window layer is an increase of at least 5%.

In some embodiments, the solar cell is a three junction solar cell with the window layer being a doped semiconductor layer, and wherein the top solar subcell has over 1 mA/cm$^2$ of current absorbed by the top solar subcell.

In some embodiments, there further comprises an antireflection structure disposed over the window layer, including at least a sequence of four layers with successive low band gap and high band gap layers, wherein a low band gap layer is a layer with a band gap of less than 3.5 eV, and a high band gap layer is a layer with a band gap of greater than 6 eV.

In some embodiments, the antireflection structure disposed over the window layer includes a low band gap $TiO_2$ layer and a high band gap $Al_2O_3$ layer adjacent thereto disposed over the window layer.

In some embodiments, the base of the top solar subcell is composed of InGaP and the emitter of the top solar subcell is composed of InGaP, and the base of the top solar subcell has a band gap that is equal to or greater than 1.83 eV.

In some embodiments, the emitter of the top solar subcell has a thickness of 80 nm, and the window layer disposed above the top solar subcell has a thickness of less than 220 Angstroms.

In some embodiments, there further comprises a second solar subcell disposed below the top solar subcell, and a lower solar subcell disposed below the second solar subcell, wherein the top solar subcell is composed of indium gallium phosphide; wherein the second solar subcell is disposed adjacent to and lattice matched to the top solar subcell, the second solar subcell including an emitter layer composed of indium gallium phosphide, and a base layer composed of indium gallium arsenide that is lattice matched to the emitter layer; and wherein the lower solar subcell is lattice matched to said second solar subcell and is composed of germanium.

In some embodiments, the top solar subcell is composed of indium gallium aluminum phosphide and has a first band gap in the range of 2.0 to 2.2 eV; and further comprising: (i) a second solar subcell adjacent to said top solar subcell and including an emitter layer composed of indium gallium phosphide or aluminum indium gallium arsenide, and a base layer composed of aluminum indium gallium arsenide and having a second band gap in the range of approximately 1.55 to 1.8 eV and being lattice matched with the upper first solar subcell, wherein the emitter and base layers of the second solar subcell form a photoelectric junction; (ii) a third solar subcell adjacent to said second solar subcell and composed of indium gallium arsenide and having a third band gap less than that of the second solar subcell and being lattice matched with the second solar subcell; and (iii) a fourth solar subcell adjacent to said third solar subcell and composed of germanium and having a fourth band gap of approximately 0.67 eV; wherein the average band gap of all four subcells is equal to or greater than 1.35 eV, the average band gap of the solar cell being the numerical average of the lowest band gap material used in each subcell.

In some embodiments, the growth substrate is composed of germanium, and further comprising:
a first solar subcell disposed over or in the growth substrate; a graded interlayer directly disposed over the first solar subcell; sequence of layers of semiconductor material forming a solar cell disposed over the grading interlayer comprising a plurality of subcells including a second solar subcell disposed over and lattice mismatched with respect to the growth substrate, and at least a third solar subcell disposed over the second subcell, and wherein the top solar subcell is disposed over the third solar subcell; wherein the graded interlayer has a band gap equal to or greater than that of the second subcell and is compositionally graded to lattice match the growth substrate on one side and the second subcell on the other side; and being composed of any of the As, P, N, Sb based III-V compound semiconductors subject to the constraints of having the in-plane lattice parameter in each of the sublayers of the grading interlayer throughout its thickness being greater than or equal to the lattice constant of the growth substrate, and includes a plurality of N step-graded sublayers (where N is an integer and the value of N is 3<N<10), wherein each successive sublayer has an incrementally greater lattice constant than the sublayer below it.

In some embodiments the band gap of the graded interlayer remains constant throughout its thickness with a value in the range of 1.15 eV to 1.41 eV throughout its thickness, and a thickness in the range of 100 to 500 nm.

In some embodiments the third and fourth solar subcells are lattice marched to the second solar subcell.

In some embodiments one or more of the solar subcells have a base region and an emitter region forming a p-n junction, the base region having a gradation in doping that increases exponentially from a value in the range of $1\times10^{15}$ to $1\times10^{18}$ free carriers per cubic centimeter adjacent the p-n junction to a value in the range of $1\times10^{16}$ to $4\times10^{18}$ free carriers per cubic centimeter adjacent to the adjoining layer at the rear of the region, and an emitter region having a gradation in doping that decreases from a value in the range of approximately $5\times10^{18}$ to $1\times10^{17}$ free carriers per cubic centimeter in the region immediately adjacent the adjoining layer to a value in the range of $5\times10^{15}$ to $1\times10^{18}$ free carriers per cubic centimeter in the region adjacent to the p-n junction.

In some embodiments there further comprises:
a distributed Bragg reflector (DBR) structure disposed between a first solar subcell and a second or lower solar subcell and composed of a plurality of alternating layers of lattice mismatched materials with discontinuities in their respective indices of refraction and arranged so that light can enter and pass through the upper solar subcell and at least a first portion of which light having a first spectral width wavelength range including the band gap of the first middle solar subcell can be reflected back into the upper solar subcell by the DBR structure, and a second portion of which light in a second spectral width wavelength range corresponding to longer wavelengths than the first spectral width wavelength range can be transmitted through the DBR structure to the lower solar subcell disposed beneath the DBR structure, and wherein the difference in refractive indices between the alternating layers in the DBR structure is maximized in order to minimize the number of periods required to achieve a given reflectivity, and the thickness and refractive index of each period of the DBR structure determines the stop and its limiting wavelength, and wherein the DBR structure includes a first DBR sublayer composed of a plurality of n type or p type Al(In)GaAs layers, and a second DBR sublayer disposed over the first DBR sublayer and composed of a plurality of n type or p type Al(In)GaAs layers, where $0<x<1$, $0<y<1$, and y is greater than x and (In) represents an amount of indium so that the DBR layers are lattice matched to the second solar subcell.

In another aspect, the present disclosure provides a method of manufacturing a solar cell comprising: forming a sequence of solar subcells with different band gaps on a substrate; the top (or light-facing) solar subcell of the sequence of solar subcells having an emitter layer and a base layer forming a photovoltaic junction; depositing a window layer over the emitter layer of the top solar subcell to a thickness of less than 30 nm; and oxidizing the entire surface of the window layer using a wet or dry or a chemical oxidation process.

In another aspect, the present disclosure provides a multijunction solar cell comprising: a top (or light-facing) solar subcell having an emitter layer, a base layer, and a window layer composed of zinc selenide and disposed adjacent to the emitter layer, the window having a band gap of greater than 4 eV and a thickness less than 30 nm.

In another aspect the present disclosure provides a method of manufacturing a multijunction solar cell comprising: growing an epitaxial sequence of solar subcells with different band gaps on a substrate including a top (light-facing) solar subcell of the sequence of solar subcells having an emitter layer and a base layer; and depositing a window layer having a band gap of 4 eV or greater over the emitter layer of the top solar subcell to a thickness of less than 30 nm.

In another aspect the present disclosure provides a method of manufacturing a solar cell comprising:
(i) growing an epitaxial sequence of solar subcells with different band gaps on a substrate; including a top (or light-facing) solar subcell of the sequence of solar subcells having an emitter layer and a base layer:
(ii) epitaxially growing a window layer over the emitter layer of the top solar subcell to a thickness of less than 30 nm; and
(iii) oxidizing the surface of the window layer.

In another aspect the present disclosure provides a method of manufacturing a solar cell comprising:
(i) growing an epitaxial sequence of solar subcells with different band gaps on a substrate, including a top (or light-facing) solar subcell of the sequence of solar subcells having an emitter layer and a base layer forming a photovoltaic junction;
(ii) depositing an oxidation stop layer over the emitter layer of the top solar subcell to a thickness of between 5 and 10 nm.
(iii) depositing a window layer over the oxidation etch stop layer of the top solar subcell to a thickness of between 10 and 40 nm; and
(iv) oxidizing the entire window layer.

In another aspect, the present disclosure provides a method of fabricating a multijunction solar cell comprising:
(i) forming a top (or light-facing) solar subcell having an emitter layer and a base layer forming a photovoltaic junction;
(ii) depositing window layer over the emitter layer being composed of a window material having a band gap of greater than 4 eV and a thickness of less than 25 nm;
(iii) growing a cap layer over the window layer; and
(iv) etching portions of the cap layer down to the surface of the window layer.

In some embodiments, portions of the window layer being exposed following etching of portions of the cap layer are subjected to an oxidation process.

In some embodiments, there further comprising depositing an antireflection structure with a sequence of layers with a lower band gap than the band gap of the window layer, followed by a directly adjacent layer with a higher band gap than the band gap of the window layer, is deposited over the cap layer.

In another aspect the present disclosure provides a method of manufacturing a solar cell comprising:
(i) forming a tandem sequence of solar subcells with different band gaps on a substrate, the top (or light-facing) solar subcell of the sequence of solar subcells having an emitter layer and a base layer;
(ii) depositing a window layer over the emitter layer of the top solar subcell, the window layer including a first sublayer with a thickness in the range of 5 to 10 nm and an Al content of 50 to 65% by mole fraction, and a second sublayer deposited over the first layer with a thickness in the range of 25 to 100 nm and an Al content of less than 50% by mole fraction; and (iii) oxidizing the second sublayer of the window layer.

In another aspect the present disclosure provides a method of manufacturing a solar cell comprising:

(i) forming a tandem sequence of solar subcells with different band gaps on a substrate, including a top (or light-facing) solar subcell, the top solar subcell having an emitter layer and a base layer;

(ii) depositing a passivation layer over the emitter layer of the top solar subcell;

(iii) depositing a window layer over the passivation layer;

(iv) depositing a cap layer over the window layer;

(v) depositing a metal grid layer over portions of the cap layer;

(vi) etching portions of the cap layer down to the passivation layer; and (vii) oxidizing the exposed portions of the window layer.

In another aspect the present disclosure provides a method of manufacturing a solar cell comprising:

forming a tandem sequence of solar subcells with different band gaps on a substrate; including a top (or light-facing) solar subcell, the top solar subcell having an emitter layer and a base layer;

depositing a window layer over the emitter layer of the top solar subcell to a thickness of less than 30 nm;

depositing a cap layer over portions of the window layer; and oxidizing the exposed surface of the window layer using a wet, dry, or chemical oxidation process.

In some embodiments, the window material located at the interface between the top surface of the emitter layer of the solar subcell and the bottom of the window is in compression with the emitter, and the material at the top surface of the window layer is in tension.

More particularly, the present disclosure is concerned with a window layer with a specific composition which results in a corresponding change in the photon absorption in the material throughout the thickness of the window layer allowing greater current to be generated in the top subcell.

In some embodiments, the emitter of the top solar subcell has a thickness of 80 nm, and the window layer has a thickness of less than 220 Angstroms.

In some embodiments, the base of the top solar subcell has a thickness of less than 700 nm.

In some embodiments, the base of the top solar subcell has a thickness of 670 nm.

In some embodiments, the top solar subcell is composed of an InGaP emitter layer and an InGaP base layer, the second subcell is composed of GaInP emitter layer and a GaAs base layer, and further comprising at least a third subcell composed of a Ge emitter layer and a Ge base layer.

In some embodiments, the third solar subcell has a band gap of 0.67 eV, the second solar subcell has a band gap in the range of approximately 1.35 to 1.50 eV and the top solar subcell has a band gap in the range of 1.87 to 2.2 eV.

In some embodiments, the multijunction solar cell comprises a second solar subcell disposed below the top solar subcell and a bottom solar subcell disposed below the second solar subcell, wherein (i) the top subcell is composed of indium gallium phosphide;

(ii) the second solar subcell is disposed adjacent to and lattice matched to said top solar subcell, the second solar subcell including an emitter layer composed of indium gallium phosphide, and a base layer composed of indium gallium arsenide that is lattice matched to the emitter layer; and (iii) the bottom solar subcell is lattice matched to said second solar subcell and is composed of germanium.

In some embodiments, the multijunction solar cell is a four junction solar cell with:

(i) the top solar subcell composed of indium gallium aluminum phosphide and having a first band gap in the range of 2.0 to 2.2 eV;

(ii) a second solar subcell adjacent to said top solar subcell and including an emitter layer composed of indium gallium phosphide or aluminum indium gallium arsenide, and a base layer composed of aluminum indium gallium arsenide and having a second band gap in the range of approximately 1.55 to 1.8 eV and being lattice matched with the upper first solar subcell, wherein the emitter and base layers of the second solar subcell form a photoelectric junction;

(iii) a third solar subcell adjacent to said second solar subcell and composed of indium gallium arsenide and having a third band gap less than that of the second solar subcell and being lattice matched with the second solar subcell; and (iv) a fourth solar subcell adjacent to said third solar subcell and composed of germanium and having a fourth band gap of approximately 0.67 eV.

In some embodiments of the four junction solar cell, the average band gap of all four subcells is equal to or greater than 1.35 eV, the average band gap of the solar cell being the numerical average of the lowest band gap material used in each subcell. U.S. patent application Ser. No. 17/180,210 filed Feb. 19, 2021 illustrates and describes a number of such four junction solar cells embodiments in FIGS. 2, 3 and 4 thereof, and is hereby incorporated by reference in its entirety.

In another aspect, the present disclosure provides a method of manufacturing a solar cell comprising: forming an upper first solar subcell having a first band gap under the top surface of the window layer; forming a second solar subcell adjacent to said first solar subcell and having a second band gap smaller than said first band gap; forming a third solar subcell adjacent to said second solar subcell and having a third band gap smaller than said second band gap; and forming a window layer over the top solar subcell, the window layer being less than 30 nm in thickness, and being formed by wet or dry oxidation of the window material.

In some embodiments, the base of the top solar subcell has a thickness of less than 400 nm.

In some embodiments, the base of the upper first solar subcell has a thickness of 260 nm.

In some embodiments, additional layer(s) may be added or deleted in the cell structure without departing from the scope of the present disclosure.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

The invention will be better and more fully appreciated by reference to the following detailed description when considered in conjunction with the accompanying drawings, wherein.

GLOSSARY OF TERMS

Figure 1:
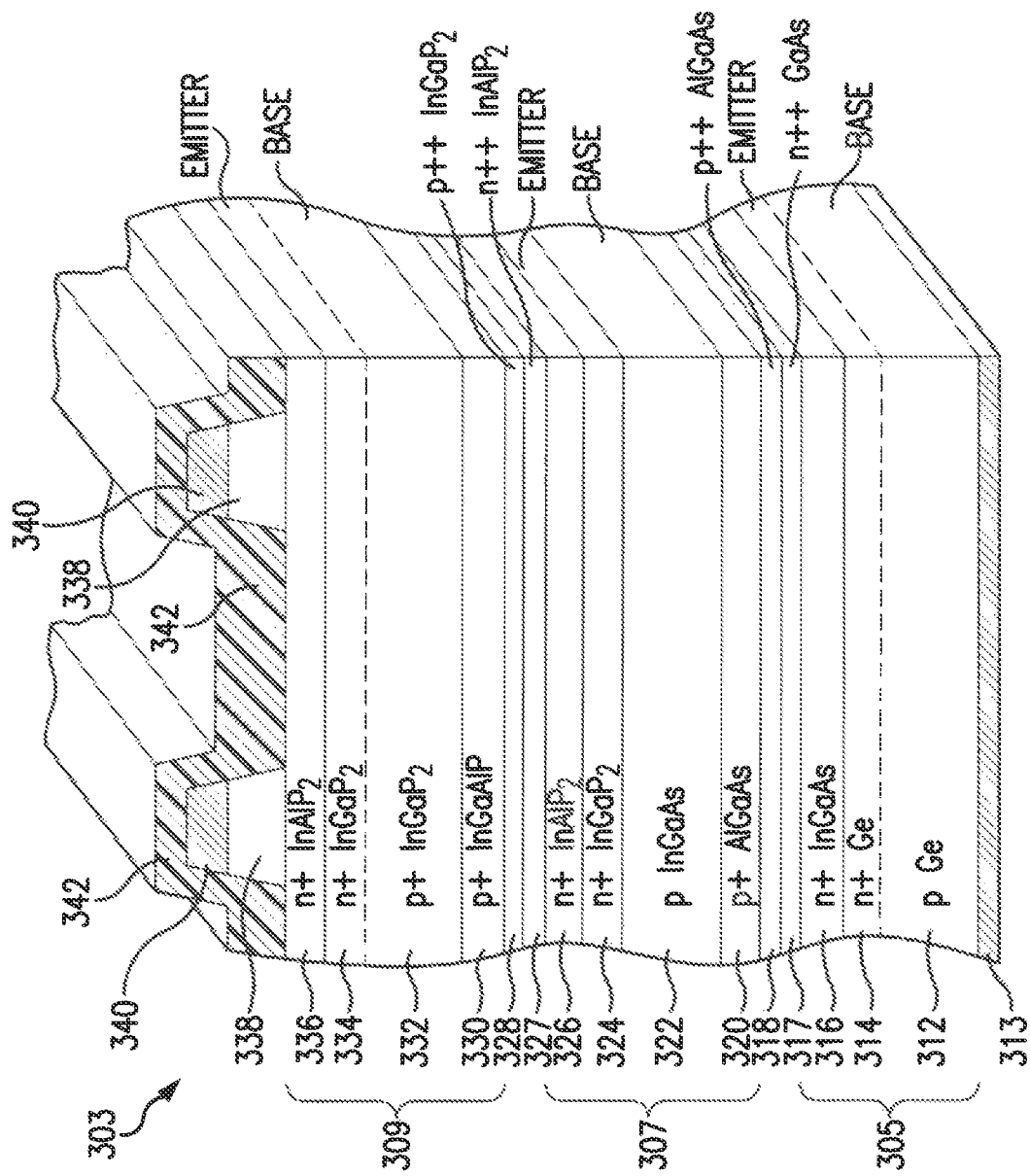
FIG. 1 is a cross-sectional view of the solar cell of a multijunction solar cell after several stages of fabrication including the deposition of certain semiconductor layers on the growth substrate up to the grid lines.

"III-V compound semiconductor" refers to a compound semiconductor formed using at least one element from group III of the periodic table and at least one element from group V of the periodic table. III-V compound semiconductors include binary, tertiary and quaternary compounds. Group III includes boron (B), aluminum (Al), gallium (Ga), indium (In) and thallium (T). Group V includes nitrogen (N), phosphorus (P), arsenic (As), antimony (Sb) and bismuth (Bi).

"Average band gap" of multijunction solar cell refers to the numerical average of lowest band material in each subcell of the multijunction solar cell.

"Band gap" refers to an energy difference (e.g., in electron volts (eV)) separating the top of the valence band and the bottom of the conduction band of a semiconductor material. More particularly, the expression "band gap" of a solar subcell, which internally has layers of different band gaps shall be defined to mean the band gap of the layer of the solar subcell in which the majority of the charge carriers are generated (such sublayer typically being the p-type base semiconductor layer of the base/emitter photovoltaic junction of such subcell). In the event such layer in turn has sublayers with different band gaps (such as the case of a base layer having a graded composition and more particularly a graded band gap), the sublayer of that solar subcell with the lowest band gap shall be taken as defining the "band gap" of such a subcell. Apart from a solar subcell, and more generally in the case of a specifically designated semiconductor region (such as a metamorphic layer), in which that semiconductor region has sublayers or subregions with different band gaps (such as the case of a semiconductor region having a graded composition and more particularly a graded band gap), the sublayer or subregion of that semiconductor region with the lowest band gap shall be taken as defining the "band gap" of that semiconductor region.

"Beginning of Life (BOL)" refers to the time at which a photovoltaic power system is initially deployed in operation. In practice, the BOL performance of a solar cell is measured experimentally in a laboratory on earth prior to the solar cell being deployed in outer space.

"Bottom subcell" refers to the subcell in a multijunction solar cell which is furthest from the primary light source for the solar cell.

"CIC" (or Cell-Interconnected-Cover glass) refers to the fabricated combination of an individual solar cell together with electrical interconnects to the solar cell and a cover glass mounted on and bonded to the upper surface of the solar cell.

"Compound semiconductor" refers to a semiconductor formed using two or more chemical elements.

"Current density" refers to the short circuit current density $J_{sc}$ through a solar subcell through a given planar area, or volume, of semiconductor material constituting the solar subcell.

"Deposited", with respect to a layer of semiconductor material, refers to a layer of material which is epitaxially grown over another semiconductor layer (such as in an MOCVD reactor) so as to form a monolithic crystalline semiconductor structure.

"Dopant" refers to a trace impurity element that is contained within a semiconductor material to affect the electrical or optical characteristics of that material. As used in the context of the present disclosure, typical dopant levels in semiconductor materials are in the $10^{16}$ to $10^{19}$ atoms per cubic centimeter range. The standard notation or nomenclature, when a particular identified dopant is proscribed, is to use, for example, the expression "GaAs:Se" or "GaAs:C" for selenium or carbon doped gallium arsenide respectively. Whenever a ternary or quaternary compound semiconductor is expressed as "AlGaAs" or "GaInAsP", it is understood that all three or four of the constituent elements are much higher in mole concentration, say on the 1% level or above, which is in the $10^{21}$ atoms/cm$^3$ or larger range. Such constituent elements are not considered "dopants" by those skilled in the art since the atoms of the constituent element form part of the crystal structure (i.e., are situated on the crystal lattice sites) of the compound semiconductor. In addition, a further distinction is that a dopant has a different valence number than the constituent component elements. In a commonly implemented III-V compound semiconductor such as AlGaInAs, none of the individual elements Al, Ga, In, or As are considered to be dopants since they have the same valence as the component atoms that make up the crystal lattice.

"End of Life (EOL)" refers to a predetermined time or times after the Beginning of Life, during which the photovoltaic power system has been deployed and has been operational. The EOL time or times may, for example, be specified by the customer as part of the required technical performance specifications of the photovoltaic power system to allow the solar cell designer to define the solar cell subcells and sublayer compositions of the solar cell to meet the technical performance requirement at the specified time or times, in addition to other design objectives. The terminology "EOL" is not meant to suggest that the photovoltaic power system is not operational or does not produce power after the EOL time.

"Epitaxial or epitaxially grown" refers to a semiconductor growth process using a reactor (such as a MOCVD reactor) in which the atomic lattice planes of two adjacent semiconductor layers of the same or different composition are continuous across the planar interface between the two layers.

"Graded interlayer" (or "grading interlayer")—see "metamorphic layer".

"Inverted metamorphic multijunction solar cell" or "IMM solar cell" refers to a solar cell in which the subcells are deposited or grown on a substrate in a "reverse" sequence such that the higher band gap subcells, which would normally be the "top" subcells facing the solar radiation in the final deployment configuration, are deposited or grown on a growth substrate prior to depositing or growing the lower band gap subcells.

"Layer" refers to a relatively planar sheet or thickness of semiconductor or other material. The layer may be deposited or grown, e.g., by epitaxial or other techniques.

"Lattice mismatched" refers to two adjacently disposed materials or layers (with thicknesses of greater than 100 nm) having in-plane lattice constants of the materials in their fully relaxed state differing from one another by more than 0.1% in lattice constant. (Applicant expressly adopts this definition for the purpose of this disclosure, and notes that this definition is considerably more stringent than that proposed, for example, in U.S. Pat. No. 8,962,993, which suggests more than 0.6% lattice constant difference).

"Metamorphic layer" or "graded interlayer" refers to a layer that achieves a gradual transition in lattice constant generally throughout its thickness in a semiconductor structure.

"Middle subcell" refers to a subcell in a multijunction solar cell which is neither a Top Subcell (as defined herein) nor a Bottom Subcell (as defined herein).

"Multijunction solar cell" refers to a solar cell constituting an integral, monolithic crystalline semiconductor structure forming a photovoltaic semiconductor device, comprising a plurality of vertically arranged and adjacent photovoltaic junctions or subcells, in which the subcells are epitaxially grown using a reactor (such as a MOCVD reactor) on a bulk semiconductor substrate in a process sequence such that (a) in a "direct" growth process, the higher band gap subcells, which would normally be the "top" subcells facing the incoming light source radiation in the final deployment configuration, are deposited or grown on a growth substrate subsequent to depositing or growing the lower band gap subcells, or (b) in an "inverted" growth process, in a process sequence such that the higher band gap subcells are deposited or grown on the growth substrate prior to depositing or growing the lower band gap subcells. A mechanically "stacked" arrangement of discrete semiconductor "chips" each of which may constitute a discrete photovoltaic device and aligned and bonded together by an adhesive or similar material shall not be deemed a "multijunction solar cell" as that term is used by Applicant in the context of this disclosure.

"Short circuit current ($I_{sc}$)" refers to the amount of electrical current through a solar cell or solar subcell when the voltage across the solar cell is zero volts, as represented and measured, for example, in units of milliAmps (mA).

"Short circuit current density"—see "current density".

"Solar cell" refers to an electronic device operable to convert the energy of light directly into electricity by the photovoltaic effect.

"Solar cell assembly" refers to the combination of a solar cell together with one or more discrete optical, electrical, or mechanical (structural) subcomponents.

"Solar cell subassembly" refers to a subset of a solar cell assembly, such as a solar cell together with only discrete electrical interconnects and/or cover glass attached to the solar cell.

"Solar subcell" refers to a sequence of layers composed of semiconductor materials including a p type base layer and an n+ type emitter layer forming a p-n photoactive junction. A solar subcell is designed to convert photons over a specific spectral or wavelength band to electrical current depending upon the band gap of the constituent semiconductor material. A solar subcell may compactly be referred to simply as a "junction" abbreviated "J". In that notation, the first subcell or junction may be referred to as the "1J" solar subcell, the second as the "2J", etc. Although the term "solar subcell" technically may refer to just the adjacent n type and p type semiconductor layers which form a photoelectric junction, in some instances the terminology "solar subcell" may also include as well the upper and lower adjacent semiconductor layers, i.e., the window and back surface field (BSF) layers, so that the aggregate four layers constitute the "solar subcell".

"Space qualified" refers to an electronic component (e.g., as used in this disclosure, to a solar cell) provides satisfactory operation under the high temperature and thermal cycling test protocols that establish typical "qualification" requirements for use by customers who utilize such components in the outer space environment. The exemplary conditions for such qualifications include (i) vacuum bake-out testing that includes exposure to a temperature of +100° C. to +135° C. (e.g., about +100° C., +110° C., +120° C., +125° C., +135° C.) for 2 hours to 24 hours, 48 hours, 72 hours, or 96 hours; and (ii) TVAC and/or APTC test that includes cycling between temperature extremes of −180° C. (e.g., about −180° C., −175° C., −170° C., −165° C., −150° C., −140° C., −128° C., −110° C., −100° C., −75° C., or −70° C.) to +145° C. (e.g., about +70° C., +80° C., +90° C., +100° C., +110° C., +120° C., +130° C., +135° C., or +145° C.) for 600 to 32,000 cycles (e.g., about 600, 700, 1500, 2000, 4000, 5000, 7500, 22000, 25000, or 32000 cycles), and in some space missions up to +180° C. See, for example, Fatemi et al., "Qualification and Production of Emcore ZTJ Solar Panels for Space Missions," Photovoltaic Specialists Conference (PVSC), 2013 IEEE 39$^{th}$ (DOI: 10.1109/PVSC 2013 6745052).

"Subcell"—see "Solar subcell".

"Substantially circular" referring to a commercially available semiconductor wafer, refers to a circular wafer having at least one straight line edge or "flat" on the edge of the wafer which is provided to enable uses of the wafer to orient the wafer in production equipment and during sequential production processes.

"Substantially current matched" refers to the short circuit current through adjacent solar subcells being substantially identical (i.e. within plus or minus 1%).

"Top subcell" or "upper subcell" refers to the subcell in a multijunction solar cell which is closest to the primary light source for the solar cell.

"UMM" or "upright metamorphic multijunction solar cell" refers to a solar cell in which the subcells are deposited or grown on a substrate in a sequence such that the lower band gap subcells are deposited or grown on a growth substrate prior to depositing or growing the higher band gap subcells also including one or more metamorphic layers.

"Upright multijunction solar cell" refers to a solar cell in which the subcells are deposited or grown on a substrate in a sequence such that the lower band gap subcells are deposited or grown on a growth substrate prior to depositing or growing the higher band gap subcells.

"ZTJ" refers to the product designation of a commercially available SolAero Technologies Corp. triple junction solar cell.

DESCRIPTION OF THE EMBODIMENTS

Details of the present disclosure will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

A variety of different features of multijunction solar cells and inverted metamorphic multijunction solar cells are disclosed in the related applications noted above. Some, many or all of such features may be included in the structures and processes associated with the solar cells of the present disclosure. However, more particularly, the present disclosure is directed in one embodiment to the composition of the window layer in the top subcell, and the antireflection coating disposed over the window layer.

More generally, however, the present disclosure may be adapted to upright or inverted metamorphic multijunction solar cells as disclosed in the related applications that may include three, four, five, or six subcells, with band gaps in the range of 1.8 to 2.2 eV (or higher) for the top subcell, and 1.3 to 1.8 eV, 0.9 to 1.2 eV for the middle subcells, and 0.6 to 0.8 eV, for the bottom subcell, respectively.

The present disclosure provides a process for the design and fabrication of a window layer in a multijunction solar cell that improves light capture in the associated top subcell and thereby the overall efficiency of the solar cell. More specifically, the present disclosure intends to provide a relatively simple and reproducible technique that is suitable for use in a high volume production environment in which various semiconductor layers are deposited in an MOCVD reactor, and subsequent processing steps are defined and selected to minimize any physical damage to the quality of the deposited layers, thereby ensuring a relatively high yield of operable solar cells meeting specifications at the conclusion of the fabrication processes.

Another aspect of the present disclosure is the design of the antireflective coating layer (ARC) disposed over the window layer. An antireflective coating is typically formed by a stack of several thin-film interference layers with alternating lower and higher refractive index layers (e.g., a first set of silicon dioxide layers interleaved with a second set of silicon nitride layers). The lower refractive index layers may form upper-most and lower-most layers of the coating. As examples, the coating may be a seven-layer coating having four lower refractive index layers and three higher refractive index layers or five-layer coating having the lower refractive index layers and two higher refractive index layers. The layers may have thickness and materials that configure the coating to exhibit a photopic reflectance of less than 1.5% and transmittance of greater than 4% within range of wavelengths associated with the incoming light received by the solar subcells. With the implementation of a new window layer with high band gap according to the present disclosure, it is important that a suitable ARC be designed to match the characteristics of the new window layer, as will be subsequently described.

Prior to discussing the specific embodiments of the present disclosure, a brief discussion of some of the issues associated with the design of multijunction solar cells, and the context of the composition or deposition of various specific layers and in particular the top window layer in embodiments of the product as specified and defined by Applicant is in order.

There are a multitude of properties that should be considered in specifying and selecting the composition of, inter alia, a specific semiconductor layer, the back metal layer, the adhesive or bonding material, or the composition of the supporting material for mounting a solar cell thereon. For example, some of the properties that should be considered when selecting a particular layer or material are electrical properties (e.g. conductivity), optical properties (e.g., band gap, absorbance and reflectance), structural properties (e.g., thickness, strength, flexibility, Young's modulus, etc.), chemical properties (e.g., growth rates, the "sticking coefficient" or ability of one layer to adhere to another, stability of dopants and constituent materials with respect to adjacent layers and subsequent processes, etc.), thermal properties (e.g., thermal stability under temperature changes, coefficient of thermal expansion), and manufacturability (e.g., availability of materials, process complexity, process variability and tolerances, reproducibility of results over high volume, reliability and quality control issues).

In view of the trade-offs among these properties, it is not always evident that the selection of a material based on one of its characteristic properties is always or typically "the best" or "optimum" from a commercial standpoint or for Applicant's purposes. For example, theoretical studies may suggest the use of a quaternary material with a certain band gap for a particular subcell would be the optimum choice for that subcell layer based on fundamental semiconductor physics. As an example, the teachings of academic papers and related proposals for the design of very high efficiency (over 40%) solar cells may therefore suggest that a solar cell designer specify the use of a quaternary material (e.g., InGaAsP) for the active layer of a subcell. A few such devices may actually be fabricated by other researchers, efficiency measurements made, and the results published as an example of the ability of such researchers to advance the progress of science by increasing the demonstrated efficiency of a compound semiconductor multijunction solar cell. Although such experiments and publications are of "academic" interest, from the practical perspective of the Applicants in designing a compound semiconductor multijunction solar cell to be produced in high volume at reasonable cost and subject to manufacturing tolerances and variability inherent in the production processes, such an "optimum" design from an academic perspective is not necessarily the most desirable design in practice, and the teachings of such studies more likely than not point in the wrong direction and lead away from the proper design direction. Stated another way, such references may actually "teach away" from Applicant's research efforts and the ultimate solar cell design proposed by the Applicants.

In view of the foregoing, it is further evident that the identification of one particular constituent element (e.g. indium, or aluminum) in a particular subcell, or the thickness, band gap, doping, or other characteristic of the incorporation of that material in a particular subcell, is not a "result effective variable" that one skilled in the art can simply specify and incrementally adjust to a particular level and thereby increase the efficiency of a solar cell. The efficiency of a solar cell is not a simple linear algebraic equation as a function of the amount of gallium or aluminum or other element in a particular layer. The growth of each of the epitaxial layers of a solar cell in an MOCVD reactor is a non-equilibrium thermodynamic process with dynamically changing spatial and temporal boundary conditions that is not readily or predictably modeled. The formulation and solution of the relevant simultaneous partial differential equations covering such processes are not within the ambit of those of ordinary skill in the art in the field of solar cell design.

Even when it is known that particular variables have an impact on electrical, optical, chemical, thermal or other characteristics, the nature of the impact often cannot be predicted with much accuracy, particularly when the variables interact in complex ways, leading to unexpected results and unintended consequences. Thus, significant trial and error, which may include the fabrication and evaluative testing of many prototype devices, often over a period of time of months if not years, is required to determine whether a proposed structure with layers of particular compositions, actually will operate as intended, let alone whether it can be fabricated in a reproducible high volume manner within the manufacturing tolerances and variability inherent in the production process, and necessary for the design of a commercially viable device.

Furthermore, as in the case here, where multiple variables interact in unpredictable ways, the proper choice of the combination of variables can produce new and unexpected results, and constitute an "inventive step".

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), or other vapor deposition methods for the growth may enable the layers in the monolithic semiconductor structure forming the cell to be grown with the required thickness, elemental composition, dopant concentration and grading and conductivity type.

The present disclosure is directed to a growth process using a metal organic chemical vapor deposition (MOCVD) process in a standard, commercially available reactor suitable for high volume production. More particularly, the present disclosure is directed to the materials and fabrication steps that are particularly suitable for producing commercially viable multijunction solar cells or inverted metamorphic multijunction solar cells using commercially available equipment and established high-volume fabrication processes, as contrasted with merely academic expositions of laboratory or experimental results.

It should be noted that the layers of a certain target composition in a semiconductor structure grown in an MOCVD process are inherently physically different than the layers of an identical target composition grown by another process, e.g. Molecular Beam Epitaxy (MBE). The material quality (i.e., morphology, stoichiometry, number and location of lattice traps, impurities, and other lattice defects) of an epitaxial layer in a semiconductor structure is different depending upon the process used to grow the layer, as well as the process parameters associated with the growth. MOCVD is inherently a chemical reaction process, while MBE is a physical deposition process. The chemicals used in the MOCVD process are present in the MOCVD reactor and interact with the wafers in the reactor, and affect the composition, doping, and other physical, optical and electrical characteristics of the material. For example, the precursor gases used in an MOCVD reactor (e.g. hydrogen) are incorporated into the resulting processed wafer material, and have certain identifiable electro-optical consequences which are more advantageous in certain specific applications of the semiconductor structure, such as in photoelectric conversion in structures designed as solar cells. Such high order effects of processing technology do result in relatively minute but actually observable differences in the material quality grown or deposited according to one process technique compared to another. Thus, devices fabricated at least in part using an MOCVD reactor or using a MOCVD process have inherent different physical material characteristics, which may have an advantageous effect over the identical target material deposited using alternative processes.

FIG. 1 illustrates one example of a multijunction solar cell device 303 which may be used to implement the window layer as provided by the present disclosure. In the Figure, each dashed line indicates the active region junction between a base layer and emitter layer of a subcell.

As shown in the illustrated example of FIG. 1, the bottom subcell 305 includes a substrate 312 formed of p-type germanium ("Ge") which also serves as a base layer. A contact pad 313 formed on the bottom of base layer 312 provides electrical contact to the multijunction solar cell 303. The bottom subcell 305 further includes, for example, a highly doped n-type Ge emitter layer 314, and an n-type indium gallium arsenide ("InGaAs") buffer layer 316. The buffer layer is deposited over the base layer 312, and the emitter layer is formed in the substrate by diffusion of deposits into the Ge substrate, thereby forming the n-type Ge layer 314. Heavily doped p-type aluminum gallium arsenide ("AlGaAs") and heavily doped n-type gallium arsenide ("GaAs") tunneling junction layers 318, 317 may be deposited over the nucleation layer 316 to provide a low resistance pathway between the bottom and middle subcells.

In the illustrated example of FIG. 1, the middle subcell 307 includes a highly doped p-type aluminum gallium arsenide ("AlGaAs") back surface field ("BSF") layer 320, a p-type InGaAs base layer 322, a highly doped n-type indium gallium phosphide ("InGaP2") emitter layer 324 and a highly doped n-type indium aluminum phosphide ("AlInP2") window layer 326. The InGaAs base layer 322 of the middle subcell 307 can include, for example, approximately 1.5% In. Other compositions may be used as well. The base layer 322 is formed over the BSF layer 320 after the BSF layer is deposited over the tunneling junction layers 318 of the bottom subcell 304.

The BSF layer 320 is provided to reduce the recombination loss in the middle subcell 307. The BSF layer 320 drives minority carriers from a highly doped region near the back surface to minimize the effect of recombination loss. Thus, the BSF layer 320 reduces recombination loss at the backside of the solar cell and thereby reduces recombination at the base layer/BSF layer interface. The window layer 326 is deposited on the emitter layer 324 of the middle subcell B. The window layer 326 in the middle subcell B also helps reduce the recombination loss and improves passivation of the cell surface of the underlying junctions. Before depositing the layers of the top cell C, heavily doped n-type InGaP and p-type AlGaAs tunneling junction layers 327, 328 may be deposited over the middle subcell B.

In the illustrated example, the top subcell 309 includes a highly doped p-type indium gallium aluminum phosphide ("InGaAlP") BSF layer 330, a p-type InGaP2 base layer 332, a highly doped n-type InGaP2 emitter layer 334 and a highly doped n-type InAlP2 window layer 336. The base layer 332 of the top subcell 309 is deposited over the BSF layer 330 after the BSF layer 330 is formed over the tunneling junction layers 328 of the middle subcell 307. The window layer 336 is deposited over the emitter layer 334 of the top subcell after the emitter layer 334 is formed over the base layer 332. Details of the window layer as taught by the present disclosure will be discussed in connection with FIG. 2A.

A cap or contact layer 338 may be deposited and patterned into separate contact regions over the window layer 336 of the top subcell 308. The cap or contact layer 338 serves as an electrical contact from the top subcell 309 to metal grid layer 340. The doped cap or contact layer 338 can be a semiconductor layer such as, for example, a GaAs or InGaAs layer.

After the cap or contact layer 338 is deposited, the grid lines 340 are formed. The grid lines 340 are deposited via evaporation and lithographically patterned and deposited over the cap or contact layer 338. The mask is subsequently lifted off to form the finished metal grid lines 340 as depicted in the Figure, and the portion of the cap layer that has not been metallized is removed, exposing the surface of the window layer 336. In some embodiments, a trench or channel (not shown), or portion of the semiconductor structure, is also etched around each of the solar cells. These channels define a peripheral boundary between the solar cell (later to be scribed from the wafer) and the rest of the wafer, and leaves a mesa structure (or a plurality of mesas, in the case of more than one solar cell per wafer) which define and constitute the solar cells later to be scribed and diced from the wafer.

As more fully described in U.S. patent application Ser. No. 12/218,582 filed Jul. 16, 2008, hereby incorporated by reference, the grid lines 340 are preferably composed of Ti/Au/Ag/Au, although other suitable materials may be used as well.

Figure 2A:
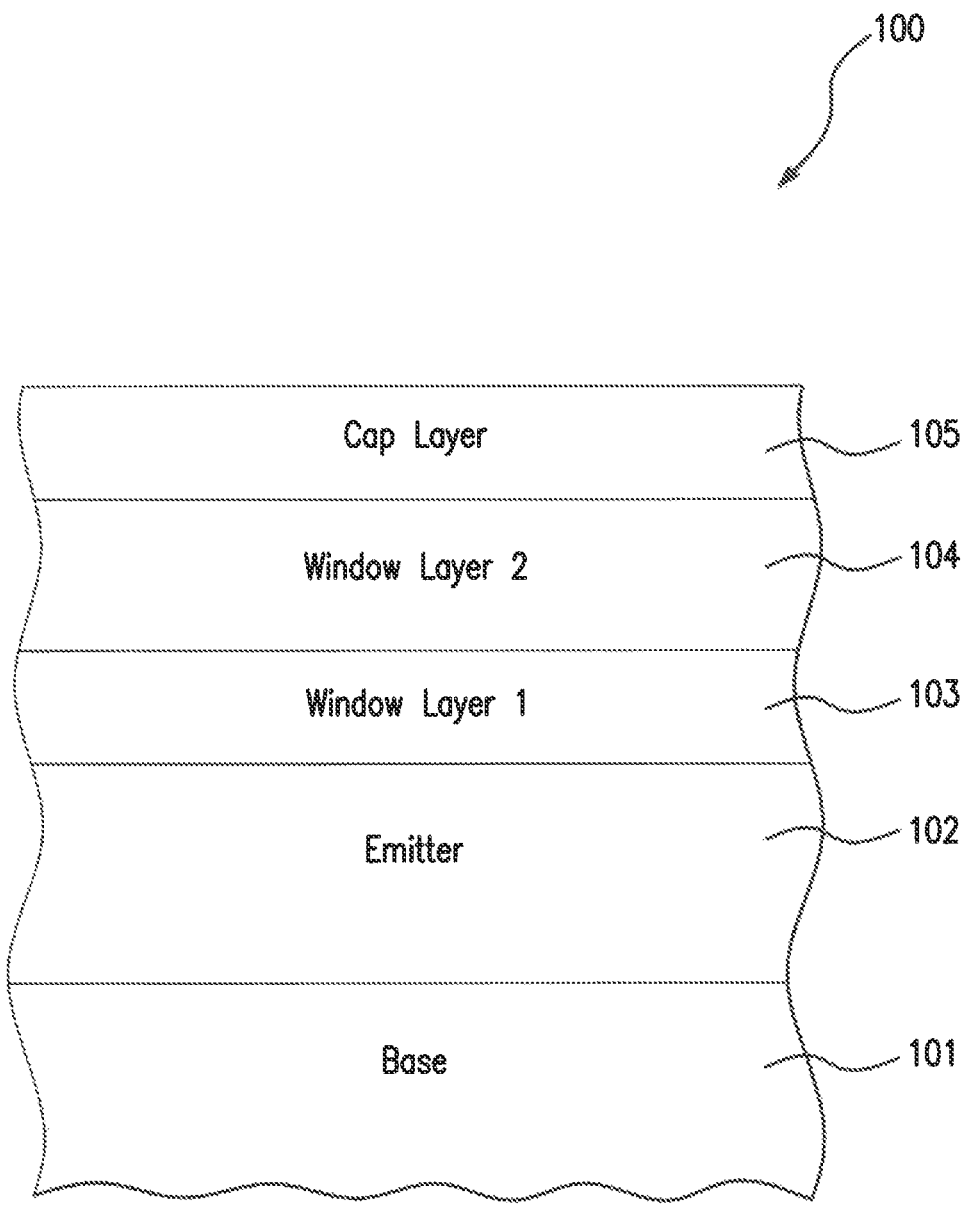
FIG. 2A is a highly simplified cross sectional view of the semiconductor layers structure including the window layer directly above the top solar subcell according to the present disclosure.

FIG. 2A is a highly simplified cross sectional view of the semiconductor layer structure including the window layer disposed directly above the top solar subcell of a multijunction solar cell according to the present disclosure.

The emitter 102 and base 101 of the top solar subcell are illustrated which would correspond to layers 334 and 332 in FIG. 1 On top of the emitter 102 a first window sublayer 103 is grown which will function as an oxidation stop layer as well as preventing minority carrier recombination at the top surface of the emitter layer. In some embodiments, such layer is from 5 to 10 nm in thickness and is lattice matched with the emitter layer.

A second window sublayer 104 is grown on top of first window sublayer 103 and has a substantially greater thickness than first window sublayer 103, such as in the range of 25 to 80 nm. The second window sublayer has a different composition than that of the first window sublayer 103 and in some embodiments has an Al content of from 65 to 80% by mole fraction. Some implementations include a passivation layer 107 between the first sublayer 103 and a second sublayer 108 of the window layer (see FIGS. 2C and 2D).

A cap layer 105 is then grown over the second window sublayer 104.

From a processing perspective, the thickness of the second window sublayer is designed so that in some embodiments, upon completion of the oxidation process only a portion of the thickness of the second window layer is oxidized, that is less than the entire thickness of the second window layers. Such process operation may be controlled by adjusting the time and temperature of the oxidation process or other parameter so as to move precisely and consistently define the oxidized thickness.

In some embodiments, more than two sublayers of the window layer with different composition and thickness are provided.

Figure 2B:
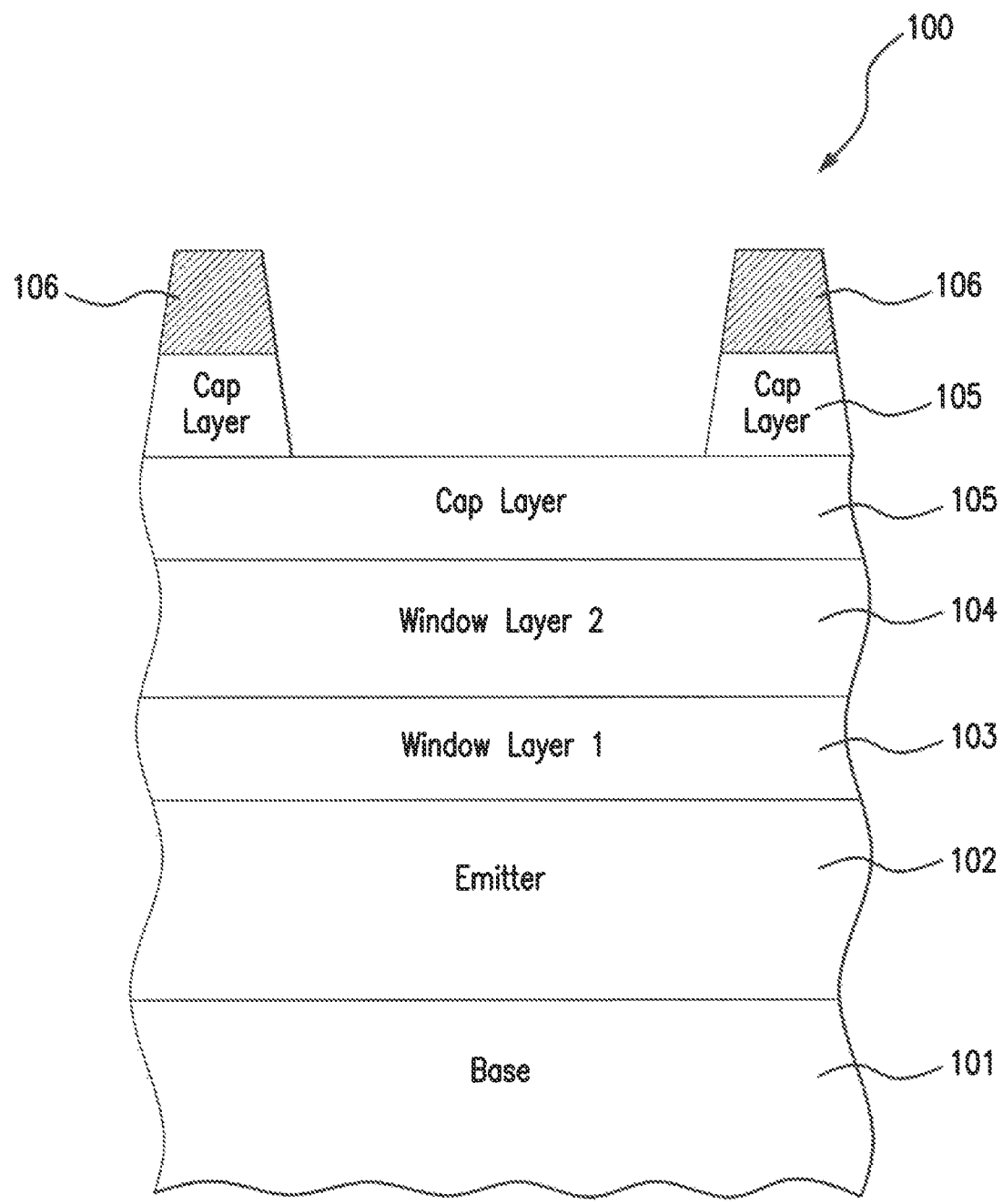
FIG. 2B is a highly simplified cross sectional view of the structure of FIG. 2A after the next process step in which the cap layer is etched according to the present disclosure.

FIG. 2B is a highly simplified cross sectional view of the structure of FIG. 2A after the next process steps according to the present disclosure.

A photoresist mask (not shown) is placed over the cap layer 105 to form the grid lines 106. The grid lines 106 are deposited via evaporation and lithographically patterned and deposited over the cap layer 105. The mask is then subsequently lifted off to form the finished metal grid lines 106 as depicted in the Figures.

As more fully described in U.S. patent application Ser. No. 12/218,582 filed Jul. 18, 2008, hereby incorporated by reference, the grid lines 106 are preferably composed of Pd/Ge/Ti/Pd/Au, although other suitable materials may be used as well.

In the next process step, the grid lines 106 are used as a mask to etch down the surface to the window layer 104 using a citric acid/peroxide etching mixture or other suitable etchant.

Figure 2C:
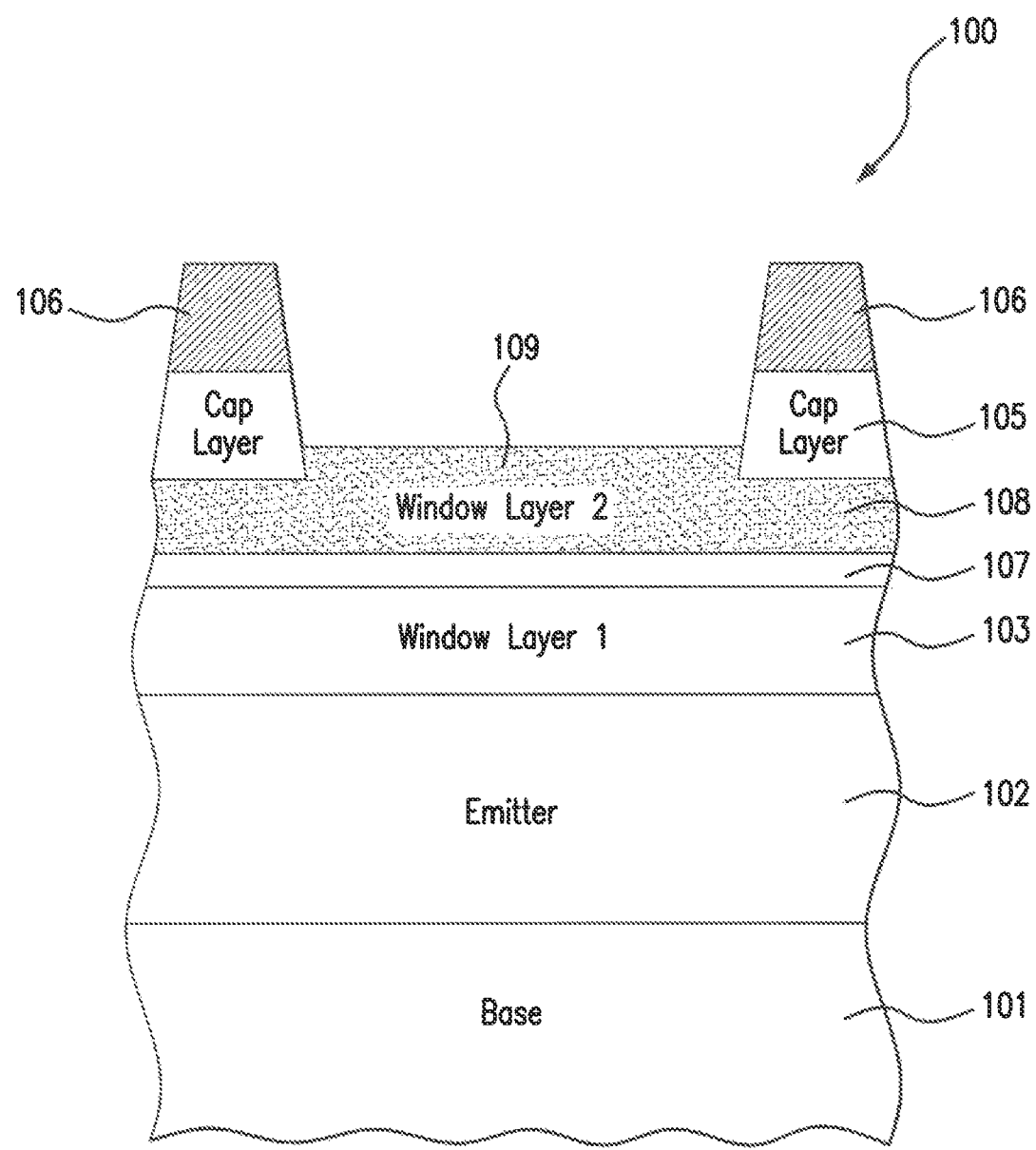
FIG. 2C is a highly simplified cross sectional view of the structure of FIG. 2B after oxidation according to the present disclosure.

FIG. 2C is a highly simplified cross sectional view of the structure of FIG. 2B after oxidation according to the present disclosure.

Figure 2D:
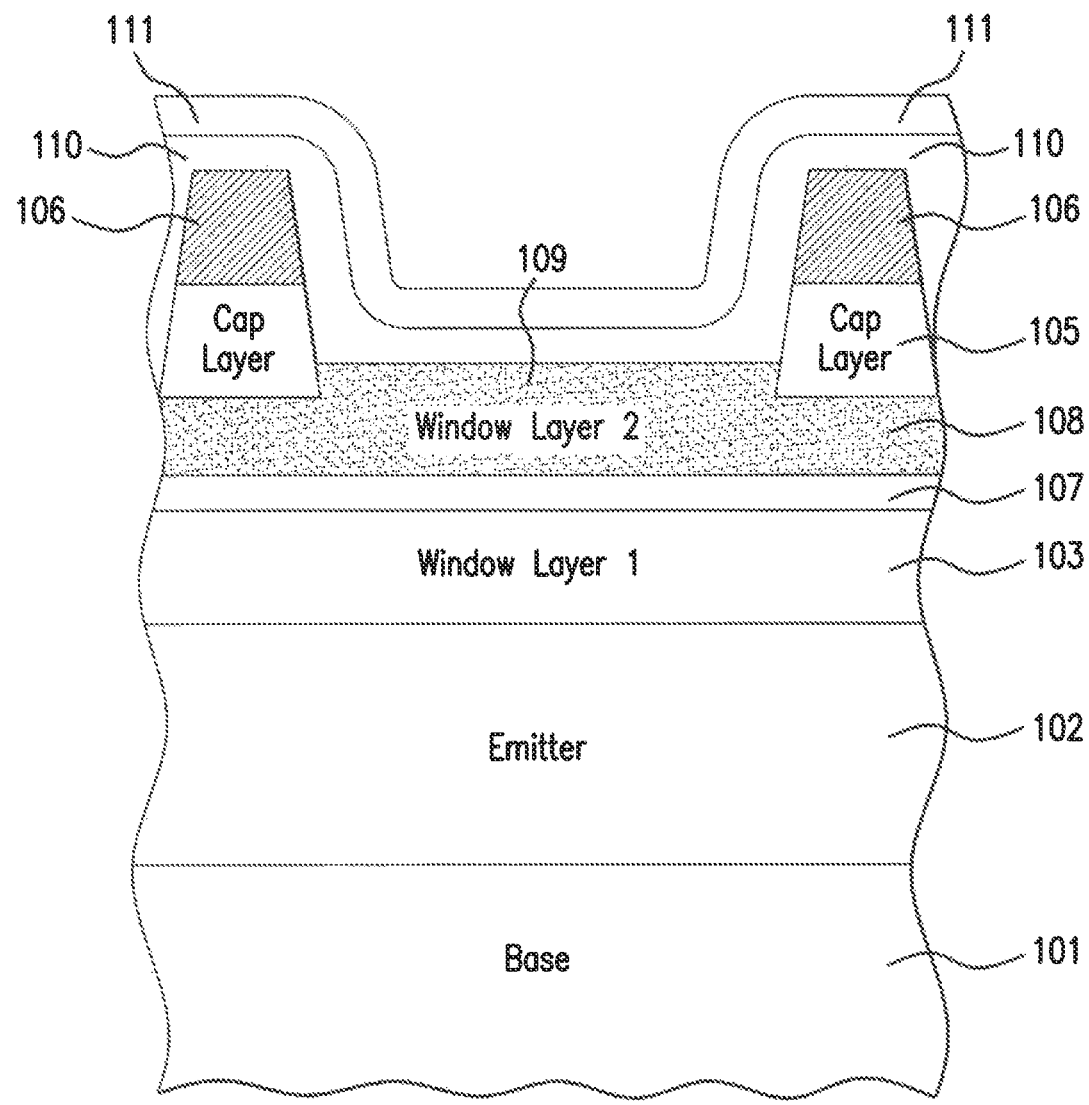
FIG. 2D is a highly simplified cross sectional view of the structure of FIG. 2C after deposition of the ARC layers according to the present disclosure.

FIG. 2D is a highly simplified cross sectional view of the structure of FIG. 2C after deposition of the ARC layers 110, 111 according to the present disclosure.

U.S. Pat. No. 9,356,162 of Pan et al has been noted above, and in the discussion of the features of the present disclosure the distinctions over Pan et al should be noted.

More specifically, the Pan patent teaches a thermal oxidation process such as wet oxidation to form the oxidized window layer (column 5, lines 29-30). A separate oxidation furnace (column 5, lines 61-62) is utilized, distinct from the reactor used for the growth of epitaxial layers on the substrate (column 4, lines 50-52). A "standard" solar cell device with the window layer takes place subsequent to the etching of a cap layer (column 7, lines 39-41, and FIG. 5 steps 503, 505).

Figure 3:
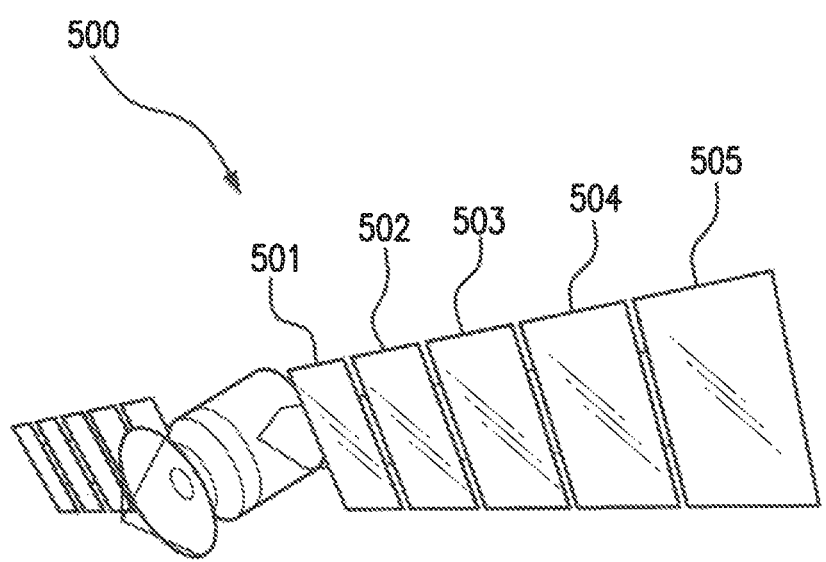
FIG. 3 is a first embodiment of a space vehicle incorporating a photoelectric power system according to the present disclosure.

FIG. 3 is a highly simplified perspective view of a first embodiment of a space vehicle incorporating a photoelectric power system according to the present disclosure. The space vehicle 500 includes a plurality of foldable substantially rectangular panels 501, 502, 503, 504, etc. which extend from the vehicle to form "wings".

Figure 4:
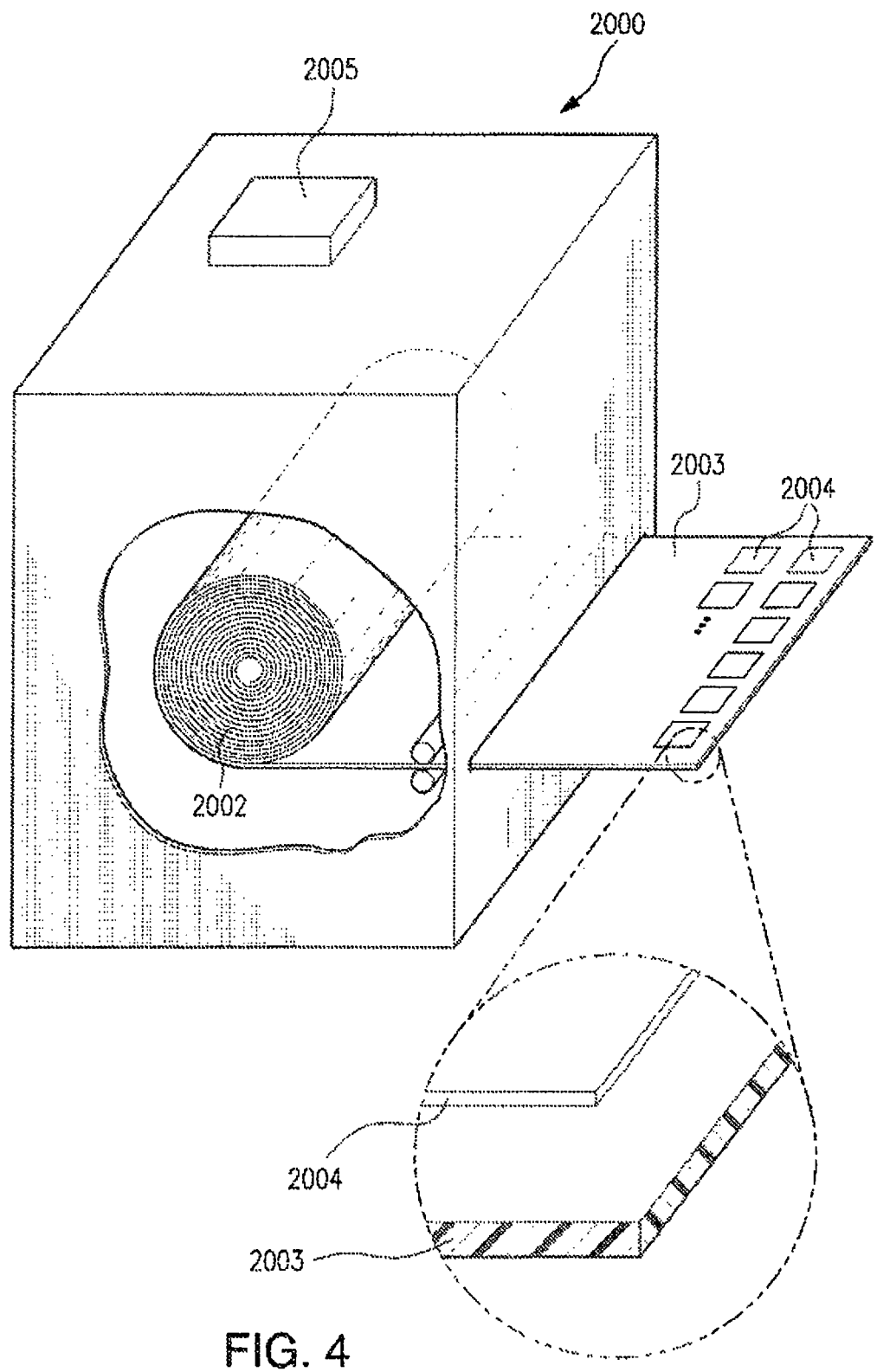
FIG. 4 is a second embodiment of a space vehicle incorporating a photoelectric power system with roll-out deployment according to the present disclosure.

FIG. 4 is a highly simplified perspective view of a second embodiment of a space vehicle incorporating a photoelectric power system with roll-out deployment according to the present disclosure. In this embodiment, the space vehicle 2000 incorporates a solar cell array 2004 mounted on a deployable flexible sheet 2003 in which the solar cell array 2004 incorporates the solar cells or solar cell modules according to the present disclosure.

The sheet 2003 may wrap around a mandrel 2002 prior to being deployed in space. One of the advantages of such an arrangement is that the storage volume in the launch vehicle for the solar cell array is relatively low, thereby enabling either an increased payload size or a smaller volume launch vehicle requirement. The space vehicle 2000 includes a payload 2005 which is powered by the array of solar cell assemblies 2004.

Figure 5:
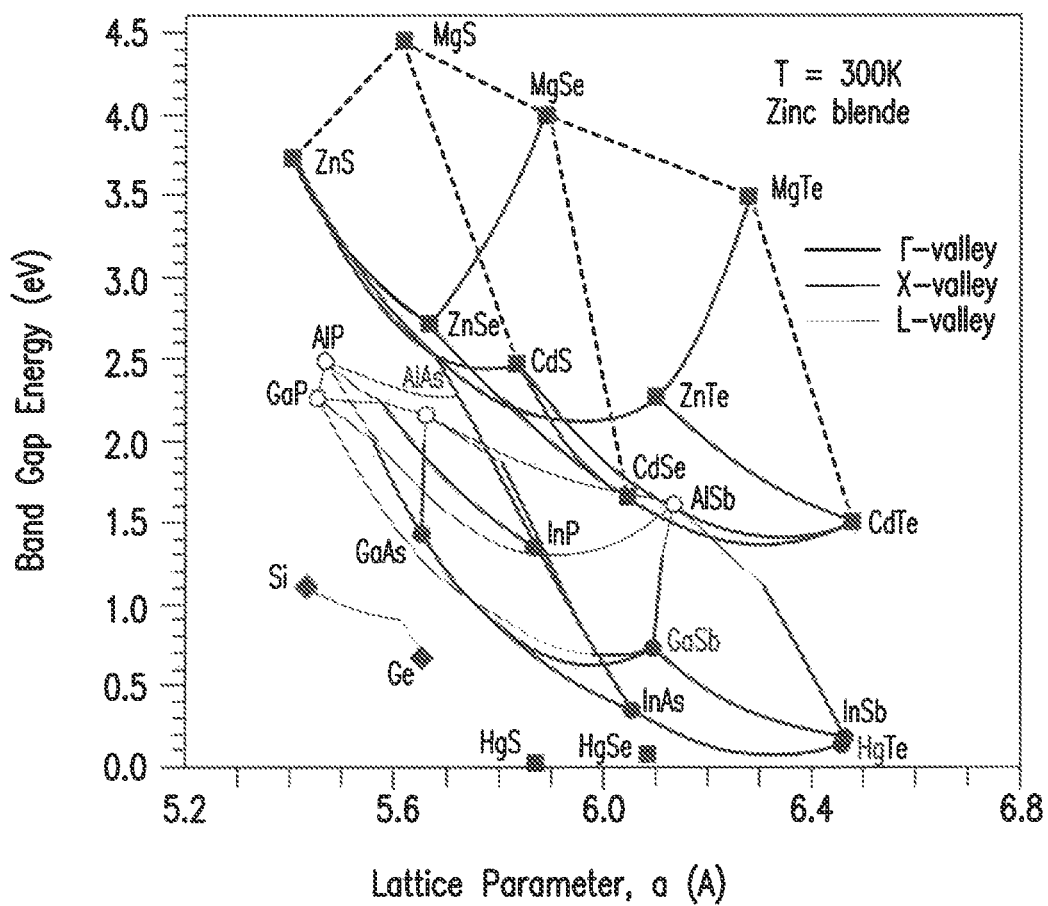
FIG. 5 is a graph representing the band gap at certain binary material and their lattice constants.

FIG. 5 is a graph representing the band gap at certain binary material and their lattice constants. The band gap and lattice constants of ternary materials are located on the lines drawn between typical associated binary materials (such as the ternary material GaAlAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

The zinc blend lattice structure materials such as ZnS, ZnSe, MgS, MgSe, CdS, CdSe suitable for the window layer according to one embodiment of the present disclosure are depicted, and ternary materials such as MgSeS, ZnCdSe, ZnCdS are similarly located on lines drawn between the corresponding binary materials.

The lattice constants and electrical properties of the layers in the semiconductor structure are preferably controlled by specification of appropriate reactor growth temperatures and time, and by use of appropriate chemical composition and dopants. The use of vapor deposition method, such as Organo Metallic Vapor Phase Epitaxy (OMVPE), metal Organic Chemical Vapor deposition (MOCVD), Molecular Beam Epitaxy (MBE), or other vapor depositions methods for the reverse growth may enable the layers in the monolithic semiconductor structure forming the call to be grown with the required thickness, elemental composition, dopant concentration and grading and conductivity type.

Figure 6:
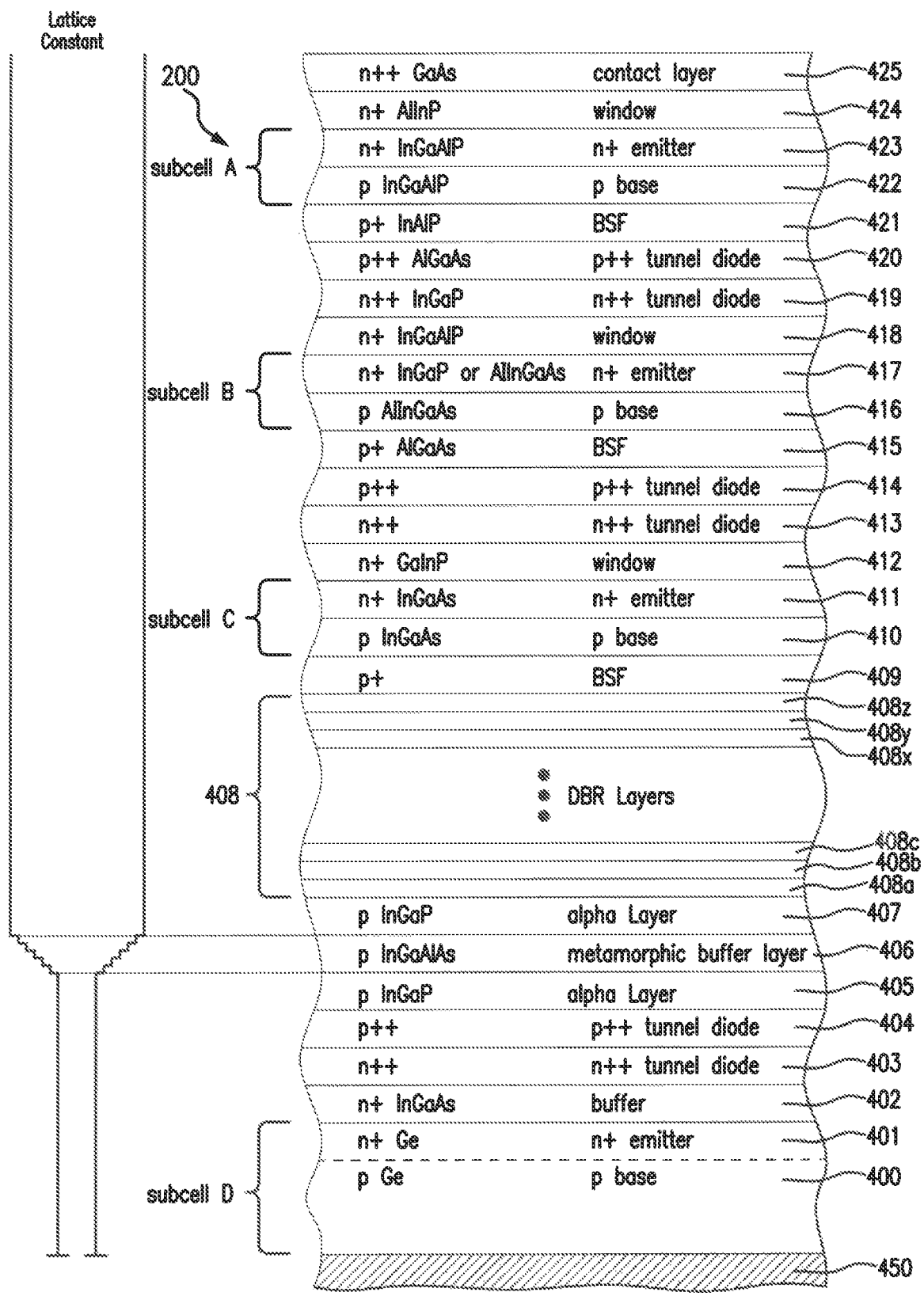
FIG. 6 is a cross-sectional view of the solar cell of a four junction solar cell after several stages of fabrication including the deposition of certain semiconductor layers on the growth substrate up to the grid lines, according to the present disclosure.

Turning to one embodiment of the multijunction solar cell device of the present disclosure, FIG. 6 is a cross-sectional view of an embodiment of a four junction solar cell 200 after several stages of fabrication including the growth of certain semiconductor layers on the growth substrate up to the contact layer 425, with various subcells being similar to the structure described and depicted in related U.S. patent application Ser. No. 15/681,144, filed Aug. 18, 2017, now U.S. Pat. No. 10,700,230.

As shown in the illustrated example of FIG. 6, the bottom subcell D includes a substrate 400 formed of p-type germanium ("Ge") which also serves as a base layer. A back metal contact pad 450 formed on the bottom of base layer 400 provides electrical contact to the multijunction solar cell. The bottom subcell D, further includes, for example, a highly doped n-type Ge emitter layer 401, and an n-type indium gallium arsenide ("InGaAs") buffer layer 402. The buffer layer is deposited over the base layer, and the emitter layer is formed in the substrate by diffusion of deposits into the Ge substrate, thereby forming the n-type Ge layer 401. Heavily doped p-type aluminum gallium arsenide ("AlGaAs") and heavily doped n-type gallium arsenide ("GaAs") tunneling junction layers 403, 404 may be deposited over the buffer layer to provide a low resistance pathway between the bottom and middle subcells.

A first alpha layer 405, preferably composed of n-type AlGaInAsP, is deposited over the tunnel diode 403/404, to a thickness of from 0.25 to about 1.0 micron. Such an alpha layer is intended to prevent threading dislocations from propagating, either opposite to the direction of growth into the bottom subcell D, or in the direction of growth into the subcell C, and is more particularly described in U.S. Patent Application Pub. No. 2009/0078309 A1 (Cornfeld et al.).

A metamorphic layer (or graded interlayer) 406 is deposited over the alpha layer 405 using a surfactant. Layer 406 is preferably a compositionally step-graded series of InGaAlAs layers, preferably with monotonically changing lattice constant, so as to achieve a gradual transition in lattice constant in the semiconductor structure from subcell D to subcell C while minimizing threading dislocations from occurring. The band gap of layer 406 is constant throughout its thickness, preferably approximately equal to 1.22 to 1.34 eV, or otherwise consistent with a value slightly greater than the band gap of the middle subcell C. One embodiment of the graded interlayer may also be expressed as being composed of $In_xGa_{1-x}As$, with x and y selected such that the band gap of the interlayer remains constant at approximately 1.22 to 1.34 eV or other appropriate band gap.

In the surfactant assisted growth of the metamorphic layer 406, a suitable chemical element is introduced into the reactor during the growth of layer 406 to improve the surface characteristics of the layer. In the preferred embodiment, such element may be a dopant or donor atom such as selenium (Se) or tellurium (Te). Small amounts of Se or Te are therefore incorporated in the metamorphic layer 406, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic one may use an isoelectronic surfactant. The term "isoelectronic" refers to surfactants such as antimony (Sb) or bismuth (Bi), since such elements have the same number of valence electrons as the P atom of InGaP, or the As atom in InGaAlAs, in the metamorphic buffer layer. Such Sb or Bi surfactants will not typically be incorporated into the metamorphic layer 406.

In one embodiment of the present disclosure, the layer 406 is composed of a plurality of layers of InGaAs, with monotonically changing lattice constant, each layer having the same band gap, approximately in the range of 1.22 to 1.34 eV. In some embodiments, the constant band gap is in the range of 1.27 to 1.31 eV. In some embodiments, the constant band gap is in the range of 1.28 to 1.29 eV.

The advantage of utilizing a constant band gap material such as InGaAs is that arsenide-based semiconductor material is much easier to process in standard commercial MOCVD reactors.

Although one embodiment of the present disclosure utilizes a plurality of layers of InGaAs for the metamorphic layer 406 for reasons of manufacturability and radiation transparency, other embodiments of the present disclosure may utilize different material systems to achieve a change in lattice constant from subcell C to subcell D. Other embodiments of the present disclosure may utilize continuously graded, as opposed to step graded, materials. More generally, the graded interlayer may be composed of any of the As, P, N, Sb based III-V compound semiconductors subject to the constraints of having the in-plane lattice parameter greater than or equal to that of the second solar cell and less than or equal to that of the third solar cell, and having a band gap energy greater than that of the second solar cell.

A second alpha layer 407, preferably composed of n+ type GaInP, is deposited over metamorphic buffer layer 406, to a thickness of from 0.25 to about 1.0 micron. Such an alpha layer is intended to prevent threading dislocations from propagating, either opposite to the direction of growth into the subcell D, or in the direction of growth into the subcell C, and is more particularly described in U.S. Patent Application Pub. No. 2009/0078309 A1 (Cornfeld et al.).

Distributed Bragg reflector (DBR) layers 408 are then grown adjacent to and between the alpha layer 407 and the third solar subcell C. The DBR layers 408 are arranged so that light can enter and pass through the third solar subcell C and at least a portion of which can be reflected back into the third solar subcell C by the DBR layers 408. In the embodiment depicted in FIG. 3A, the distributed Bragg reflector (DBR) layers 408 are specifically located between the third solar subcell C and second alpha layers 407; in other embodiments, the distributed Bragg reflector (DBR) layers may be located between first alpha layer 405 and tunnel diode layers 403/404.

For some embodiments, distributed Bragg reflector (DBR) layers 408 can be composed of a plurality of alternating layers 408a through 408z of lattice matched materials with discontinuities in their respective indices of refraction. For certain embodiments, the difference in refractive indices between alternating layers is maximized in order to minimize the number of periods required to achieve a given reflectivity, and the thickness and refractive index of each period determines the stop band and its limiting wavelength.

For some embodiments, distributed Bragg reflector (DBR) layers 408a through 408z includes a first DBR layer composed of a plurality of p type $Al_xGa_{1-x}As$ layers, and a second DBR layer disposed over the first DBR layer and composed of a plurality of p type $Al_yGa_{1-y}As$ layers, where y is greater than x.

In the illustrated example of FIG. 6, the subcell C includes a highly doped p-type aluminum gallium arsenide ("AlGaAs") back surface field ("BSF") layer 409, a p-type InGaAs base layer 410, a highly doped n-type indium gallium phosphide ("InGaP2") emitter layer 411 and a highly doped n-type indium aluminum phosphide ("AlInP2") window layer 412. The InGaAs base layer 410 of the subcell C can include, for example, approximately 1.5% In. Other compositions may be used as well. The base layer 410 is formed over the BSF layer 409 after the BSF layer is deposited over the DBR layers 408a through 408z.

The window layer 412 is deposited on the emitter layer 411 of the subcell C. The window layer 412 in the subcell C also helps reduce the recombination loss and improves passivation of the cell surface of the underlying junctions. Before depositing the layers of the subcell B, heavily doped n-type InGaP and p-type AlGaAs (or other suitable compositions) tunneling junction layers 413, 414 may be deposited over the subcell C.

The middle subcell B includes a highly doped p-type aluminum gallium arsenide ("AlGaAs") back surface field ("BSF") layer 415, a p-type AlInGaAs base layer 416, a highly doped n-type indium gallium phosphide ("InGaP2") or AlInGaAs layer 417 and a highly doped n-type indium gallium aluminum phosphide ("AlGaAlP") window layer 418. The InGaP emitter layer 417 of the subcell B can include, for example, approximately 50% In. Other compositions may be used as well.

Before depositing the layers of the top cell A, heavily doped n-type InGaP and p-type AlGaAs tunneling junction layers 419, 420 may be deposited over the subcell B.

In the illustrated example, the top subcell A includes a highly doped p-type indium aluminum phosphide ("InAlP") BSF layer 421, a p-type InGaAlP base layer 422, a highly doped n-type InGaAlP emitter layer 423 and a highly doped n-type InAlP2 window layer 424. The base layer 422 of the top subcell A is deposited over the BSF layer 421 after the BSF layer 421 is formed over the tunneling junction layers 419, 420 of the subcell B. The window layer 424 is deposited over the emitter layer 423 of the top subcell A after the emitter layer 423 is formed over the base layer 422.

A cap or contact layer 425 may be deposited and patterned into separate contact regions over the window layer 424 of the top subcell A. The cap or contact layer 425 serves as an electrical contact from the top subcell A to metal grid layer (not shown). The doped cap or contact layer 425 can be a semiconductor layer such as, for example, a GaAs or InGaAs layer.

The window layer 424 may then be processed as described in FIGS. 1 through 2D above, and such steps will not be described again here for brevity.

After the cap or contact layer 425 is deposited, and the window layer 424 oxidation has been completed the grid lines are formed via evaporation and lithographically patterned and deposited over the cap or contact layer 425.

It will be understood that each of the elements described above, or two or more together, also may find a useful application in other types of structures or constructions differing from the types of structures or constructions described above.

Although described embodiments of the present disclosure utilizes a vertical stack of three subcells, various aspects and features of the present disclosure can apply to stacks with fewer or greater number of subcells, i.e. two junction cells, four junction cells, five, six, seven junction cells, etc. In the case of seven or more junction cells, the use of more than two metamorphic grading interlayer may also be utilized.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAs Sb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the solar cell described in the present disclosure has been illustrated and described as embodied in a conventional multijunction solar cell, it is not intended to be limited to the details shown, since it is also applicable to inverted metamorphic solar cells, and various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand, LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:
1. A multijunction solar cell comprising:
 a plurality of solar subcells on a semiconductor growth substrate, the plurality of solar subcells comprising a top solar subcell having an emitter layer and a base layer forming a photovoltaic junction; and
 a window layer disposed over the emitter layer of the top solar subcell, the window layer including:
  a first sublayer having a thickness in a range of 5 to 10 nm and an aluminum content of 50 to 65% by mole fraction, and
  a second sublayer over the first layer, the second sublayer having a thickness in a range of 25 to 100 nm, an aluminum content of less than 50% by mole fraction, and a band gap of greater than 2.5 eV.
2. A multijunction solar cell as defined in claim 1, wherein the second sublayer of the window layer is oxidized throughout its entire thickness.
3. A multijunction solar cell as defined in claim 2 wherein the first sublayer is an oxidation stop layer composed of InAlP.
4. A multijunction solar cell as defined in claim 1, further comprising:
 a passivation layer disposed over the emitter layer of the top solar subcell, with the second sublayer of the window layer being disposed directly over the passivation layer; and
 a cap layer disposed over part of the window layer.
5. A multijunction solar cell as defined in claim 1, further comprising an antireflection structure disposed over the window layer, the antireflection structure including at least a sequence of four layers with successive low band gap and high band gap layers, wherein a low band gap layer is a layer with a band gap of less than 3.5 eV, and a high hand gap layer is a layer with a band gap of greater than 6 eV.
6. A multijunction solar cell as defined in claim 1, further comprising a multilayer antireflection structure disposed over the window layer, the antireflection structure including a low band gap $TiO_2$ layer and a high band gap $Al_2O_3$ layer adjacent thereto disposed over the window layer.
7. A multijunction solar cell as defined in claim 1, wherein the base of the top solar subcell has a band gap that is equal to or greater than 1.83 eV.
8. A multijunction solar cell as defined in claim 1, wherein the emitter of the top solar subcell has a thickness of 80 nm.
9. A multijunction solar cell as defined in claim 1 wherein the growth substrate is composed of germanium, and the multijunction solar cell comprising:
 a first solar subcell disposed over or in the growth substrate;
 a graded interlayer directly disposed over the first solar subcell;
 a sequence of layers of semiconductor material forming a second solar subcell disposed over and lattice mismatched with respect to the growth substrate, and at least a third solar subcell disposed over the second subcell,
 wherein the top solar subcell is disposed over the third solar subcell;
 wherein the graded interlayer has a band gap equal to or greater than that of the second subcell and is compositionally graded to lattice match the growth substrate on one side and the second solar subcell on another side, the graded interlayer including a plurality of N step-graded sublayers (where N is an integer and the value of N is 3<N<10), wherein each successive sublayer has an incrementally greater lattice constant than the sublayer below it, the graded interlayer being composed of any of the As, P, N, Sb based III-V compound semiconductors subject to constraints of having an in-plane lattice parameter in each of the sublayers of the grading interlayer throughout its thickness being greater than or equal to a lattice constant of the growth substrate.
10. A multijunction solar cell as defined in claim 9, wherein:
 the top solar subcell is composed of a semiconductor compound including at least indium, aluminum and phosphorus;
 the third solar subcell is composed of (i) an emitter layer composed of indium gallium phosphide or (aluminum) indium gallium arsenide, and a base layer composed of (aluminum) indium gallium arsenide; or (ii) a semiconductor compound including at least indium, aluminum and phosphorus; and
 the second solar cell is composed of indium gallium arsenide phosphide.
11. A multijunction solar cell as defined in claim 9, wherein the band gap of the graded interlayer remains constant throughout its thickness with a value in the range of

1.15 eV to 1.41 eV, and wherein the graded interlayer has a thickness in the range of 100 to 500 nm.

12. A multijunction solar cell as defined in claim 9, further comprising a fourth solar subcell disposed over the third solar subcell, wherein the third and fourth solar subcells are lattice matched to the second solar subcell.

13. A multijunction solar cell as defined in claim 1, wherein at least one of the solar subcells has a base region and an emitter region forming a p-n junction, the base region having a gradation in doping that increases exponentially from a value in the range of $1\times10^{15}$ to $1\times10^{18}$ free carriers per cubic centimeter adjacent the p-n junction to a value in the range of $1\times10^{16}$ to $4\times10^{18}$ free carriers per cubic centimeter adjacent to an adjoining layer at a rear of the base region, and the emitter region having a gradation in doping that decreases from a value in the range of approximately $5\times10^{18}$ to $1\times10^{17}$ free carriers per cubic centimeter in the emitter region immediately adjacent the adjoining layer to a value in the range of $5\times10^{15}$ to $1\times10^{18}$ free carriers per cubic centimeter in the region emitter adjacent to the p-n junction.

14. A multijunction solar cell as defined in claim 1, further comprising:
a distributed Bragg reflector (DBR) structure disposed between the top solar subcell and a lower solar subcell and composed of a plurality of alternating layers of lattice mismatched materials with discontinuities in their respective indices of refraction and arranged so that light can enter and pass through the top solar subcell and at least a first portion of which light having a first spectral width wavelength range including the band gap of the top solar subcell can be reflected back into the top solar subcell by the DBR structure, and a second portion of which light in a second spectral width wavelength range corresponding to longer wavelengths than the first spectral width wavelength range can be transmitted through the DBR structure to the lower solar subcell disposed beneath the DBR structure, wherein the DBR structure includes a first DBR sublayer composed of a plurality of n type or p type $Al_x(In)Ga_{1-x}As$ layers, and a second DBR sublayer disposed over the first DBR sublayer and composed of a plurality of N type or P type $Al_y(In)Ga_{1-y}As$ layers, where 0<x<1, 0<y<1, and y is greater than x and (In) represents an amount of indium so that the DBR layers are lattice matched to the second or lower solar subcell.

15. A multijunction solar cell as defined in claim 1 wherein the second sublayer of the window layer is composed of InAlP, or AlGaAs or AlInGaAs and has a band gap greater than 4 eV, and wherein the window layer is oxidized throughout its entire thickness.

16. A method of manufacturing a solar cell comprising:
forming a sequence of solar subcells with different band gaps on a substrate, wherein a top solar subcell of the sequence of solar subcells has an emitter layer and a base layer forming a photovoltaic junction;
forming a window layer over the emitter layer of the top solar subcell, the window layer including a first sublayer having a thickness in a range of 5 to 10 nm and an aluminum content of 50 to 65% by mole fraction, and a second sublayer over the first layer, the second sublayer having a thickness in a range of 25 to 100 nm, an aluminum content of less than 50% by mole fraction, and a band gap of greater than 2.5 eV; and
oxidizing a surface of the second sublayer of the window layer using a wet or dry or a chemical oxidation process.

17. A method as defined in claim 16 including:
forming a passivation layer over the emitter layer of the top solar subcell, wherein the second sublayer of the window layer subsequently is deposited directly over the passivation layer;
forming a cap layer over second sublayer of the window layer;
etching portions of the cap layer to expose portions of the second sublayer of the window layer; and
subsequently subjecting exposed portions of the second sublayer of the window layer to an oxidation process.

18. A method as defined in claim 17 including subjecting exposed portions of the second sublayer of the window layer to the oxidation process includes subjecting the exposed portions of the second sublayer of the window layer to a wet oxidation process within a second MOCVD reactor.

19. A method as defined in claim 16, including fabricating the sequence of solar subcells and the window layer in a MOCVD reactor, and oxidizing the second sublayer of the window layer in a separate reaction apparatus.

* * * * *